(12) United States Patent
Doogue et al.

(10) Patent No.: US 7,923,996 B2
(45) Date of Patent: Apr. 12, 2011

(54) MAGNETIC FIELD SENSOR WITH AUTOMATIC SENSITIVITY ADJUSTMENT

(75) Inventors: Michael C. Doogue, Manchester, NH (US); Gerardo Monreal, Pilar Buenos Aires (AR); William P. Taylor, Amherst, NH (US)

(73) Assignee: Allegro Microsystems, Inc., Worcester, MA (US)

( * ) Notice: Subject to any disclaimer, the term of this patent is extended or adjusted under 35 U.S.C. 154(b) by 369 days.

(21) Appl. No.: 12/037,393

(22) Filed: Feb. 26, 2008

(65) Prior Publication Data

US 2009/0212765 A1    Aug. 27, 2009

(51) Int. Cl.
G01R 33/06 (2006.01)
G01R 33/07 (2006.01)
G01R 33/09 (2006.01)

(52) U.S. Cl. .................................. 324/251; 324/252

(58) Field of Classification Search .................. 324/202, 324/207.2, 207.21, 251, 252; 327/510, 511; 257/421, 425, 427; 338/32 R, 32 H
See application file for complete search history.

(56) References Cited

U.S. PATENT DOCUMENTS

| | | |
|---|---|---|
| 4,236,832 A | 12/1980 | Komatsu et al. |
| 4,438,347 A | 3/1984 | Gehring |
| 4,752,733 A | 6/1988 | Petr et al. |
| 4,760,285 A | 7/1988 | Nelson |
| 4,823,075 A | 4/1989 | Alley |
| 4,833,406 A | 5/1989 | Foster |
| 4,970,411 A | 11/1990 | Halg et al. |
| 5,247,278 A | 9/1993 | Pant et al. |
| 5,329,416 A | 7/1994 | Ushiyama et al. |
| 5,412,255 A | 5/1995 | Wallrafen |
| 5,469,058 A | 11/1995 | Dunnam |
| 5,521,501 A | 5/1996 | Dettmann et al. |
| 5,621,319 A | 4/1997 | Bilotti et al. |
| 5,640,090 A | 6/1997 | Furuya et al. |
| 6,436,748 B1 | 8/2002 | Forbes et al. |
| 6,437,558 B2 | 8/2002 | Li et al. |
| 6,853,178 B2 | 2/2005 | Hayat-Dawoodi |

(Continued)

FOREIGN PATENT DOCUMENTS

DE         195 39 458 A1    4/1997

(Continued)

OTHER PUBLICATIONS

Bilotti et al.; "Monolithic Magnetic Hall Sensor Using Dynamic Quadrature Offset Cancellation;" IEEE Journal of Solid-State Circuits; vol. 32, Issue 6; Jun. 1997; pp. 829-836.

(Continued)

Primary Examiner — Kenneth J Whittington
(74) Attorney, Agent, or Firm — Daly, Crowley, Mofford & Durkee, LLP

(57) ABSTRACT

Magnetic field sensors have a magnetic field sensing element and also a feedback circuit to provide a gain-adjustment signal to affect a sensitivity associated with the magnetic field sensing element. In some arrangements, the feedback circuit can include piezoresistors to sense a strain of a substrate over which the magnetic field sensor is disposed. With these arrangements, the feedback circuit can generate the gain-adjustment signal in accordance with the sensed strain. In other arrangements, the feedback circuit can generate pulsed magnetic fields proximate to the magnetic field sensing element in order to directly measure the sensitivity of the magnetic field sensing element. With these arrangements, the feedback circuit can generate the gain-adjustment signal in accordance with the sensed sensitivity.

23 Claims, 12 Drawing Sheets

U.S. PATENT DOCUMENTS

| | | | |
|---|---|---|---|
| 6,896,407 B2 | 5/2005 | Nomiyama et al. | |
| 7,038,448 B2 | 5/2006 | Schott et al. | |
| 7,259,545 B2 | 8/2007 | Stauth et al. | |
| 7,474,093 B2 | 1/2009 | Ausserlechner | |
| 7,518,354 B2 | 4/2009 | Stauth et al. | |
| 7,746,056 B2 | 6/2010 | Stauth et al. | |
| 2006/0202692 A1 | 9/2006 | Tatschl et al. | |
| 2007/0247141 A1* | 10/2007 | Pastre et al. | 324/202 |
| 2009/0001964 A1* | 1/2009 | Strzalkowski | 324/202 |
| 2009/0085706 A1 | 4/2009 | Baarman et al. | |
| 2010/0211347 A1 | 8/2010 | Friedrich et al. | |

FOREIGN PATENT DOCUMENTS

| | | |
|---|---|---|
| EP | 0289414 A2 | 11/1988 |
| EP | 0289414 A3 | 11/1988 |
| EP | 0357013 A2 | 3/1990 |
| EP | 0357013 A3 | 3/1990 |
| EP | 1637898 A1 | 3/2006 |
| EP | 1679524 A1 | 7/2006 |
| EP | 1850143 A1 | 10/2007 |
| GB | 2276727 A | 10/1994 |
| WO | WO 9602849 A1 | 2/1996 |
| WO | WO 2004/072672 | 8/2004 |
| WO | WO/2006/056829 | 6/2006 |
| WO | WO 2007/138508 A1 | 12/2007 |
| WO | WO 2008/048379 A1 | 4/2008 |
| WO | WO 2009/108422 A2 | 9/2009 |
| WO | WO 2009/108422 A3 | 9/2009 |
| WO | WO 2010/096367 A1 | 8/2010 |

OTHER PUBLICATIONS

Manic et al.; "Short and Long-Term Stability Problems of Hall Plates in Plastic Packages;" IEEE 38th Annual International Reliability Physics Symposium; Apr. 2000; pp. 225-230.

Munter; "Electronic Circuitry for a Smart Spinning-current Hall Plate with Low Offset;" Sensors and Actuators A; Jun. 1991;.pp. 747-751.

Munter; "A Low-offset Spinning-current Hall Plate;" Sensors and Actuators A21-A23; 1990; pp. 742-746.

Steiner et al; Offset Reduction in Hall Devices by Continuous Spinning Current Method; Sensors and Actuators A66; 1998; pp. 167-172.

Trontelj et al; "CMOS Integrated Magnetic Field Source Used as a Reference in Magnetic Field Sensors on Common Substrate;" WEP 1-6; IMTC; May 1994; pp. 461-463.

Udo; "Limits of Offset Cancellation by the Principle of Spinning Current Hall Probe;" Proceedings of IEEE Sensors; Oct. 2004; pp. 1117-1120.

Zou et al.; "Three-Dimensional Die Surface Stress Measurements in Delaminated and Non-Delaminated Plastic Packages;" 48th Electronic Components and Technology Conference; May 25, 1998; pp. 1223-1234.

Manic; "Drift in Silicon Integrated Sensors and Circuits Due to the Thermo-Mechanical Stresses;" Lausanne, École Polytechnique Fédérale De Lausanne 2000; Part 1 of 2; 74 pages.

Manic; "Drift in Silicon Integrated Sensors and Circuits Due to the Thermo-Mechanical Stresses;" Lausanne, École Polytechnique Fédérale De Lausanne 2000; Part 2 of 2; 102 pages.

Krammerer et al.: "A Hall effect sensors network insensitive to mechanical stress;" Proceedings of IEEE Sensors; vol. 3, Oct. 2004; pp. 1071-1074.

Mangnani et al.; "Mechanical Stress Measurement Electronics Based on Piezo-Resistive and Piezo-Hall Effects;" 9th International Conference on Electronics, Circuits and Systems 2002; vol. 1; SBN: 0-7803-7596-3; Dec. 2002; pp. 363-366.

Motz et al.; "An Integrated Magnetic Sensor with Two Continuous-Time ΔΣ-Converters-and Stress Compensation Capability;" IEEE International Solid-StatetirCuits•Conference; Digest of Technical Papers; Feb. 6, 2006; ISBN: 1-4244-0079-1; pp. 1151-1160.

Pastre, et al.; "A Hall Sensor-Based Ctirrent Measurement Microsystem With Continuous Gain Calibration;" Research in Microelectronics and Electronics, IEEE vol. 2; Jul. 25, 2005; ISBN: 0-7803-9345-7; pp. 95-98.

Ruther et al.; "Integrated CMOS-Based Sensor Array for Mechanical Stress Mapping;" 5th IEEE Conference on Sensors, Oct. 2007; pp. 1131-1134.

Ruther et al.; "Theromagnetic Residual OffSet in Integrated Hall Plates;" IEEE Sensors Journal; vol. 3, No. 6; Dec. 2003; pp. 693-699.

Simon et al.; "Autocalibration of Silicon Hall Devices;" 8th International Conference on Solid-State Sensors and Actuators; vol. 2; Jun. 25, 1995; pp. 237-240.

Steiner et al.; "Double-Hall Sensor with Self-Compensated Offset;" International Electron Devices Meeting; Dec. 7, 1997; ISBN: 0-7803-4100-7; pp. 911-914.

Ausserlechner et al.; "Compensation of the Piezo-Hall Effect in Integrated Hail Sensors on (100)-Si;" IEEE Sensors Journal, vol. 7, No. 11, Nov. 2007; ISBN: 1530-437X; pp. 1475-1482.

Ausserlechner et al.; "Drift of Magnetic Sensitivity of Small Hall Sensors Due to Moisture Absorbed by the IC-Package;" Proceedings of IEEE Sensors, 2004; vol. 1; Oct. 24, 2004; ISBN:0-7803-8692-2; pp. 455-458.

Ausserlechner; "The piezo-Hall effect in n-silicon for arbitrary crystal orientation;" Proceedings of IEEE Sensors; vol. 3; Oct. 24, 2004; ISBN: 0-7803-8692-2; pp. 1149-1152.

Bahreyni, et al.; "A Resonant Micromachined Magnetic Field Sensor;" IEEE Sensors Journal; vol. 7, No. 9, Sep. 2007; pp. 1326-1334.

Barrettino, et al.; "CMOS-Based Monolithic Controllers for Smart Sensors Comprising Micromembranes and Microcantilevers;" IEEE Transactions on Circuits and Systems-I Regular Papers vol. 54, No. 1; Jan. 2007; pp. 141-152.

Demierre, et al.; "Reference Magnetic Actuator for Self-Calibration of a Very Small Hall Sensor Array;" Sensors and Actuators A97-98; Apr. 2002; pp. 39-46.

Frick, et al.; "CMOS Microsystem for AC Current Measurement with Galvanic Isolation;" IEEE Sensors Journal; vol. 3, No. 6; Dec. 2003; pp. 752-760.

Motz, et al.; "A Chopped Hall Sensor with Small Jitter and Programmable "True Power-On" Function;" IEEE Journal of Solid-State Circuits; vol. 40, No. 7; Jul. 2005; pp. 1533-1540.

Motz, et al.; "An Integrated Hall Sensor Platform Design for Position, Angle and Current Sensing;" IEEE Sensors 2006; Exco, Daegu, Korea / Oct. 22-25, 2006; pp. 1008-1011.

Hosticka; "CMOS Sensor Systems;" Sensors and Actuators A66; Apr. 1998; pp. 335-341.

Pastre, et al.; "A Hall Sensor Analog Front End for Current Measurement with Continuous Gain Calibration;" IEEE Sensors Journal; vol. 7, No. 5; May 2007; pp. 860-867.

Popovic; "Sensor Microsystems;" Proc. 20th International Conference on Microelectronics (MWIL 95); vol. 2, NIS, Serbia, 12-14; Sep. 1995; pp. 531-537.

Schott, et al.; "CMOS Single-Chip Electronic Compass with Microcontroller;" IEEE Journal of Solid-State Circuits; vol. 42, No. 12; Dec. 2007; pp. 2923-2933.

PCT Search Report and Written Opinion of the ISA for PCT/US2009/031776 dated Oct. 23, 2009.

PCT Search Report and Written Opinion of the ISA for PCT/US2010/024256 dated Aug. 11, 2010.

PCT International Preliminary Report on Patentability and Written Opinion mailed Sep. 10, 2010 for PCT/US2009/031776.

Preliminary Amendment filed on Oct. 5, 2010 for U.S. Appl. No. 12/706,318.

Baschirotto et al.; "Development and Analysis of PCB Vector 2-D Magnetic Field Sensor System for Electronic Compass;" IEEE Sensors Journal vol. 6, No. 2; Apr. 2006; pp. 365-371.

Halg; "Piezo-Hall Coefficients of n-Type Silicon;" Journal of Applied Physics; vol. 64, No. 1; Jul. 1, 1988; pp. 276-282.

Kanda et al.; "The Piezo-Hall Effect in n-Silicon;" 22nd International Conference on the Physics of Semiconductors; vol. 1, Jan. 1995; pp. 89-92.

Partin et al.; "Temperature Stable Hall Effect Sensors;" IEEE Sensors Journal, vol. 6, No. 1; Feb. 2006; pp. 106-110.
Randhawa; "Monolithic Integrated Hall Devices in Silicon Circuits;" Microelectronics Journal; vol. 12, No. 6; Sep. 14-17, 1981; pp. 24-29.
Schott et al.; "Linearizing Integrated Hall Devices;" 1997 International Conference on Solid-State Sensors and Actuators, Jun. 16-19, 1997; pp. 393-396.
Stellrecht et al.; Characterization of Hygroscopic Swelling Behavior of Mold Compounds and Plastic Packages; IEEE Transactions on Components and Packaging Technologies; vol. 27, No. 3; Sep. 2004; pp. 499-506.
Tian et al.; "Multiple Sensors on Pulsed Eddy-Current Detection for 3-D Subsurface Crack Assessment;" IEEE Sensors Journal, vol. 5, No. 1; Feb. 2005; pp. 90-96.
Office Action dated Feb. 2, 2011 from U.S. Appl. No. 12/959,672.
Manic; "Drift in Silicon Integrated Sensors and Circuits Due to the Thermo-Mechanical Stresses;" Lausanne, École Polytechnique Fédérale De Lausanne 2000; 170 pages.
Schneider; "Temperature Calibration of CMOS Magnetic Vector Probe for Contactless Angle Measurement System," IEDM 1996 pp. 533-536.

* cited by examiner

MAGNETIC FIELD SENSOR WITH AUTOMATIC SENSITIVITY ADJUSTMENT

CROSS REFERENCE TO RELATED APPLICATIONS

Not Applicable.

STATEMENT REGARDING FEDERALLY SPONSORED RESEARCH

Not Applicable.

FIELD OF THE INVENTION

This invention relates generally to magnetic field sensors and, more particularly, to magnetic field sensors having circuitry to sense and adjust a sensitivity of the magnetic field sensors to a magnetic field.

BACKGROUND OF THE INVENTION

Magnetic field sensors employ a variety of types of magnetic field sensing elements, for example, Hall effect elements and magnetoresistance elements, often coupled to a variety of electronics, all disposed over a common substrate. A magnetic field sensing element (and a magnetic field sensor) can be characterized by a variety of performance characteristics, one of which is a sensitivity, which can be expressed in terms of an output signal amplitude versus a magnetic field to which the magnetic field sensing element is exposed.

The sensitivity of a magnetic field sensing element, and therefore, of a magnetic field sensor, is known to change in relation to a number of parameters. For example, the sensitivity can change in relation to a change in temperature of the magnetic field sensing element. For another example, the sensitivity can change in relation to a strain imposed upon the substrate over which the magnetic field sensing element is disposed. Such a strain can be imposed upon the substrate at the time of manufacture of an integrated circuit containing the substrate. For example, the strain can be imposed by stresses caused by curing of molding compounds used to form an encapsulation of the substrate, e.g., a plastic encapsulation.

It will be recognized that changes in the temperature of a magnetic field sensor can directly result in changes of sensitivity due to the changes of temperature. However, the changes in the temperature of the magnetic field sensor can also indirectly result in changes of sensitivity where the temperature imparts strains upon the substrate over which the magnetic field sensing element is disposed.

The changes in sensitivity of the magnetic field sensor and of the magnetic field sensing element are undesirable.

SUMMARY OF THE INVENTION

A magnetic field sensor, which includes a magnetic field sensing element, can measure, either directly or indirectly, a sensitivity of the magnetic field sensing element, and can adjust a sensitivity of the magnetic field sensor accordingly. Therefore, the magnetic field sensor maintains a sensitivity to magnetic fields that is generally invariant in the presence of temperature excursions or in the presence of manufacturing steps, both of which might otherwise tend to change the sensitivity of the magnetic field sensor.

In accordance with one aspect of the present invention, a magnetic field sensor includes a magnetic field sensing element supported by a substrate. The magnetic field sensing element is for generating an output signal comprising a magnetic-field-responsive signal portion. The magnetic-field-responsive signal portion has a sensitivity to a first magnetic field. The magnetic field sensor also includes a feedback circuit, which includes a current conductor supported by the substrate and proximate to the magnetic field sensing element. The current conductor is for generating a second magnetic field. The feedback circuit also includes a gain-calculation circuit configured to generate a gain-adjustment signal responsive to the second magnetic field. The magnetic field sensor also includes a gain-adjustment circuit supported by the substrate and having a gain-adjustment node coupled to receive the gain-adjustment signal. The gain-adjustment circuit is configured to adjust the sensitivity of the magnetic-field-responsive signal portion in response to the gain-adjustment signal.

In accordance with another aspect of the present invention, a magnetic field sensor includes a magnetic field sensing element supported by a substrate. The magnetic field sensing element is for generating an output signal comprising a magnetic-field-responsive signal portion. The magnetic-field-responsive signal portion has a sensitivity to a first magnetic field. The magnetic field sensor also includes a feedback circuit. The feedback circuit includes a first piezoresistor supported by the substrate. The first piezoresistor has a node at which a first piezoelectric output signal is generated. The first piezoelectric output signal is responsive to a strain of the substrate in a first direction. The feedback circuit also includes a second piezoresistor supported by the substrate. Each one of the first and second piezoresistors has a respective primary response axis, wherein the first and second piezoresistors are disposed in a relative orientation so that their respective primary response axes are generally perpendicular. The second piezoresistor has a node at which a second piezoelectric output signal is generated. The second piezoelectric output signal is responsive to a strain of the substrate in a second direction generally perpendicular to the first direction. The feedback circuit further includes a combining circuit having first and second input nodes coupled to receive signals related to the first and second piezoelectric output signals and having an output node at which a gain-adjustment signal is generated. The magnetic field sensor also includes a gain-adjustment circuit supported by the substrate, which has a gain-adjustment node coupled to receive the gain-adjustment signal. The gain-adjustment circuit is configured to adjust the sensitivity of the magnetic-field-responsive signal portion in response to the gain-adjustment signal.

BRIEF DESCRIPTION OF THE DRAWINGS

The foregoing features of the invention, as well as the invention itself may be more fully understood from the following detailed description of the drawings, in which.

DETAILED DESCRIPTION OF THE INVENTION

Before describing the present invention, some introductory concepts and terminology are explained. As used herein, the term "magnetic field sensor" is used to describe a circuit that includes a "magnetic field sensing element." Magnetic field sensors are used in a variety of applications, including, but not limited to, a current sensor that senses a magnetic field generated by a current flowing in a current conductor, a magnetic switch that senses the proximity of a ferromagnetic object, a rotation detector that senses passing ferromagnetic articles, for example, magnetic domains of a ring magnet, and a magnetic field sensor that senses a magnetic field density of a magnetic field. The term "magnetic field sensor" is used synonymously herein with the phrase "circuit for sensing a magnetic field."

While magnetic field sensing elements are shown and described below to be Hall effect elements, in other arrangements, the magnetic field sensing elements can be, but are not limited to, Hall effect elements, magnetoresistance elements, or magnetotransistors. As is known, there are different types of Hall effect elements, for example, a planar Hall element, and a vertical Hall element. As is also known, there are different types of magnetoresistance elements, for example, a giant magnetoresistance (GMR) element, an anisotropic magnetoresistance element (AMR), a tunneling magnetoresistance (TMR) element, and a magnetic tunnel junction (MTJ).

As used herein, the term "piezoresistor" is used to describe a circuit element that has a resistance related to a strain of the piezoresistor. Conventional piezoresistors are known. However as will become apparent, in some arrangements described below, the piezoresistors can also have a resistance related to a magnetic field experienced by the piezoresistor, and in this way, can also function as a so-called "magnetoresistor." In order for the piezoresistors described below to have a resistance related to both a strain and to a magnetic field, the piezoresistors can be made larger (e.g., longer) than conventional piezoresistors, in order to improve sensitivity of the piezoresistors to magnetic fields. However, as used herein, the term "piezoresistors" also includes conventional magnetoresistance elements.

Figure 1:
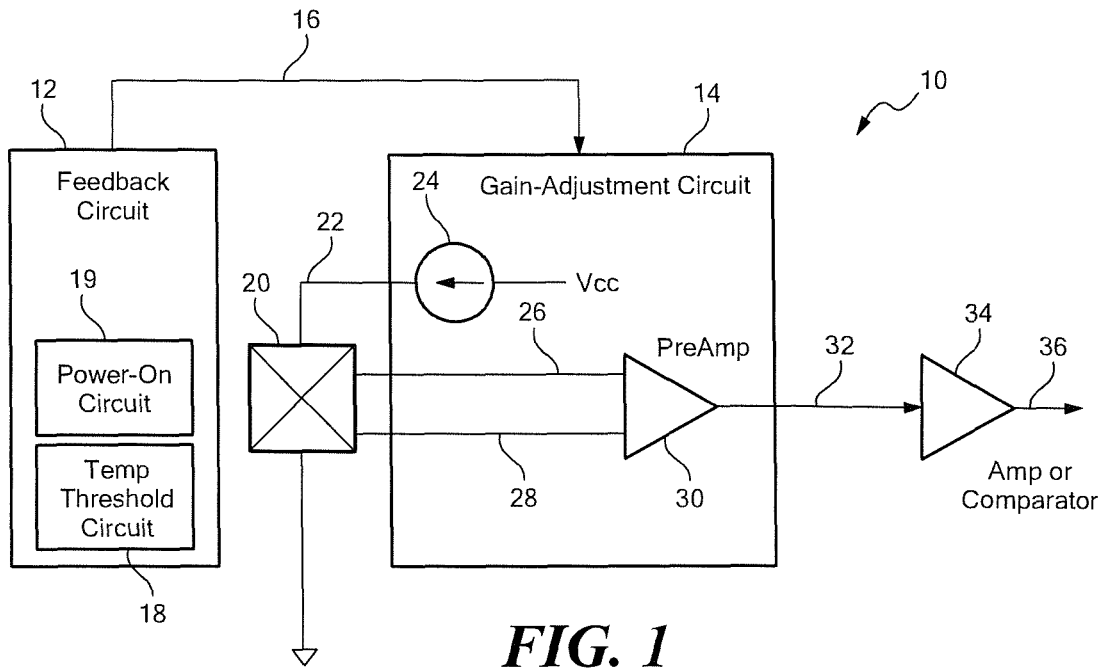
FIG. 1 is a block diagram of a circuit having a magnetic field sensing element, here a Hall effect element, coupled to a gain-adjustment circuit, wherein the gain-adjustment circuit is coupled to a feedback circuit configured to provide a gain-adjustment signal to adjust a gain of the gain-adjustment circuit, wherein, in some embodiments, the feedback circuit includes a temperature threshold circuit and or a power-on circuit.

Referring to FIG. 1, an exemplary circuit 10 for sensing a magnetic field includes a magnetic field sensing element 20, here a Hall effect element. The Hall effect element 20 is coupled to receive a drive current 22 from a current source 24 and configured to generate a differential Hall voltage signal 26, 28, which is coupled to a gain-adjustment circuit 14. The gain-adjustment circuit 14 includes the current source 24 and also includes a preamplifier 30. The preamplifier 30 is configured to amplify the differential input signal 26, 28 and to generate an amplified signal 32. The circuit 10 can also include another circuit element 34, which, in some arrangements, is a (linear) amplifier, and which, in other arrangements, is a comparator.

The circuit 10 also includes a feedback circuit 12, which is configured to sense, either directly or indirectly, a sensitivity of the Hall effect elements 20. The feedback circuit is configured to generate a gain-adjustment signal 16 coupled to the gain-adjustment circuit.

In operation, either one of (or both of) the current source 24 or the preamplifier 30 can be used as a gain adjustment element, which can affect a magnitude of the amplified signal 32 in response to the gain-adjustment signal 16.

The feedback circuit 12, in some embodiments, can include a temperature threshold circuit 18. The feedback circuit 12, in some embodiments, can also include a power-on circuit 19.

The temperature threshold circuit 18 is configured to affect the gain-adjustment signal 16, for example, so that the gain-adjustment signal 16 controls the gain of the gain-adjustment circuit 14 only when a temperature of a substrate over which the circuit 10 is disposed reaches a temperature above a temperature threshold.

The power-on circuit 18 is also configured to affect the gain-adjustment signal 16, for example, so that the gain-adjustment signal 16 controls the gain of the gain-adjustment circuit 14 only for a period of time shortly following power being applied to the circuit 10.

Figure 1A:
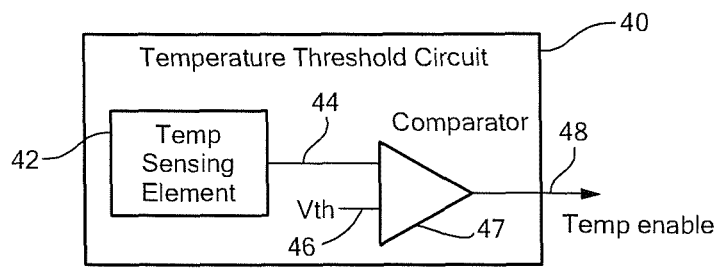
FIG. 1A is a block diagram showing an exemplary embodiment of a temperature threshold circuit that can be used as the temperature threshold circuit of FIG. 1.

Referring now to FIG. 1A, an exemplary temperature threshold circuit 40 can be the same as or similar to the temperature threshold circuit 18 of FIG. 1. The temperature threshold circuit 40 can include a temperature sensing element 42 configured to generate a temperature signal 44 responsive to a temperature of a substrate over which the temperature-sensing element 42 is disposed. A comparator 47 is coupled to receive the temperature signal 44 and to compare the temperature signal 44 to a threshold signal 46. The comparator 47 is configured to generate a temperature enable signal 48, which can, for example, take on a first state when the temperature signal 44 is below the temperature threshold signal 46 and a second state when the temperature signal 44 is above the temperature threshold signal 46.

Figure 1B:
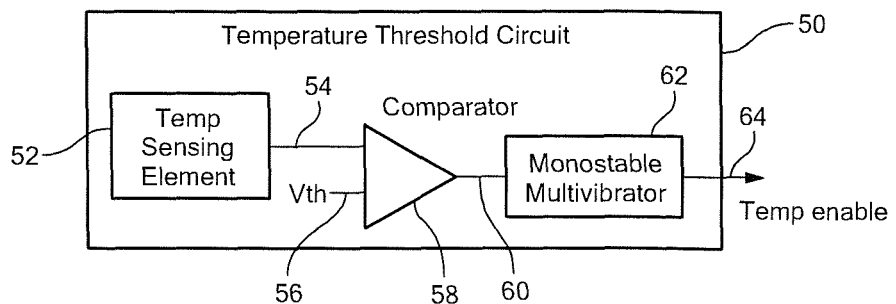
FIG. 1B is a block diagram showing another exemplary embodiment of a temperature threshold circuit that can be used as the temperature threshold circuit of FIG. 1.

Referring now to FIG. 1B, another exemplary temperature threshold circuit 50 can be the same as or similar to the temperature threshold circuit 18 of FIG. 1. The temperature threshold circuit 50 can include a temperature sensing element 52 configured to generate a temperature signal 54 responsive to a temperature of a substrate over which the temperature-sensing element 52 is disposed. A comparator 58 is coupled to receive the temperature signal 54 and to compare the temperature signal 54 to a threshold signal 56. The comparator 58 is configured to generate a comparison signal 60, which can, for example, take on a first state when the temperature signal 54 is below the temperature threshold signal 56 and a second state when the temperature signal 54 is above the temperature threshold signal 56. The temperature threshold circuit 50 can also include a monostable multivibrator 62 coupled to receive the comparison signal 60 and configured to generate a temperature enable signal 64.

In operation, the temperature enable signal 64 is a pulse signal beginning at or near to a time when the temperature signal 54 crosses a value of temperature threshold signal 56 and ending at a time determined by characteristics of the monostable multivibrator 62. In some arrangements, the pulse signal 64 has a duration of about one millisecond.

It should be appreciated that the circuit 40 of FIG. 1A can generate the temperature enable signal 48 as a substantially static signal, while the circuit 50 of FIG. 1B can generate the temperature enable signal 48 as pulse signal.

Figure 1C:
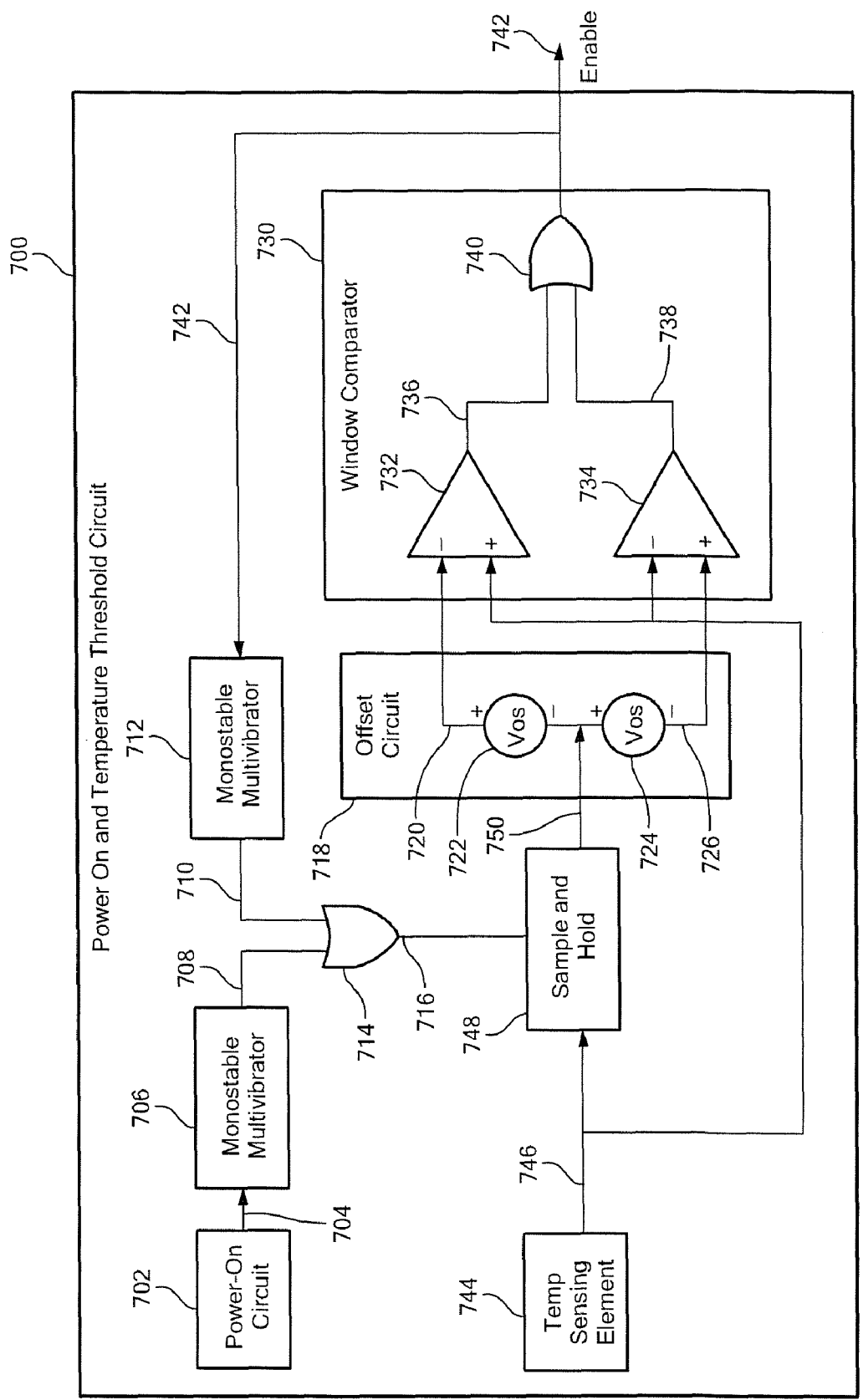
FIG. 1C is a block diagram showing a combined power-on temperature threshold circuit that can be used in place of the power-on circuit and the temperature threshold circuit of FIG. 1.

Referring now to FIG. 1C, a combined power-on and temperature threshold circuit 700 provides a change of state of an enable signal 742 both at the time of power up and also at the time of temperature excursions. The circuit 700 includes a power-on circuit 702 configured to generate a power-on signal 704 indicative of a power up of a circuit, for example, of the circuit 10 of FIG. 1.

Power-on circuits that can be used as the power-on circuit 19 of FIG. 1 or the power-on circuit 702 of FIG. 1C are known, and therefore, are not described further. However, it should be recognized that the power-on circuits 19, 702 can, in some embodiments, generate a substantially static power-on enable signal, and, in other embodiments, can generate the power-on enable signal as a pulse signal near to a time that power is applied to a circuit, for example, the circuit 10 of FIG. 1.

The circuit 700 also includes a monostable multivibrator 706 coupled to receive the power-on signal 704 and configured to generate a power-on binary pulse signal 708 having a predetermined period. The power-on binary pulse signal 708 is coupled to an OR gate 714 configured to generate a binary sampling signal 716.

The circuit 700 also includes a temperature sensing element 744 configured to generate a temperature signal 746 indicative of a temperature of a circuit, for example, the circuit 10 of FIG. 1. The temperature signal 746 is received by a sample-and-hold circuit 748, which samples the temperature signal 746 during one state of the binary sampling signal 716, resulting in a held temperature signal 750 during the other state of the binary sampling signal 716.

An offset circuit 718 is coupled to receive the held temperature signal 750. In one arrangement, the offset circuit 718 includes first and second voltage sources 722, 724, respectively, which are coupled so as to generate a positive offset held temperature signal 720 and a negative offset held temperature signal 726. It will be apparent that the positive offset held temperature signal 720 is a predetermined amount above the held temperature signal 750, for example, one hundred millivolts, and the negative offset held temperature signal 726 is a predetermined amount below the held temperature signal 750, for example, one hundred millivolts. However, in some other arrangements, the first and second voltage sources 722, 724 can be different, resulting in the positive offset held temperature signal 720 and the negative offset held temperature signal 72726 being different predetermined amounts away form the held temperature signal 750.

The positive offset held temperature signal 720 and the negative offset held temperature signal 726 are received by a window comparator 730. Window comparators can be configured with a variety of topologies and the topology shown is merely representative. The window comparator 730 is also coupled to receive the temperature signal 746.

In operation, the window comparator 730 is configured to generate a change in state of a binary window comparator output signal 742 whenever the temperature signal 752 transitions outside of a window defined by the boundaries of the positive offset held temperature signal 720 and the negative offset held temperature signal 726. In this way, the binary window comparator output signal 742 is indicative of a temperature excursion experiences by the temperature sensing element 744.

It should be apparent that the binary window comparator output signal 742 also has a change of state near to a time of power up of the circuit 700. At power up, the temperature signal 752 can rapidly achieve a value representative of the temperature, while the positive offset held temperature signal 720 and the negative offset held temperature signal 726 can more slowly approach steady values. Therefore, initially, at power up, the binary window comparator output signal 742 may be, for example, high. As the positive offset held temperature signal 720 and the negative offset held temperature signal 726 achieve more steady values, the binary window comparator output signal 742 may transition to a low state.

Also, in operation, at any time that the temperature signal 746 transitions outside of the window defined by the boundaries of the positive offset held temperature signal 720 and the negative offset held temperature signal 726, the binary window comparator output signal 742 changes state.

The binary window comparator output signal 742 can be used as an "enable" signal in circuits shown in subsequent figures. As described below, a gain adjustment, i.e., a gain calibration, of a circuit for sensing a magnetic field can occur during a high state, or, alternatively, during a low state, of the enable signal 742. From the discussion above, it will be understood that the enable signal 742 can serve to initiate such a calibration at or near to the time of a power up and also at or near to a time of a temperature excursion sensed by the temperature sensing element 744.

As used herein, the term "enable" signal is used to refer either to a temperature enable signal, to a power-on enable signal, or to a combination of both.

The enable signal 742 is coupled to another monostable multivibrator 712, which generates a temperature excursion binary pulse signal 710. The temperature excursion binary pulse signal 710 is also received by the OR gate 714, resulting in another pulse within the binary sample signal 748 when the enable signal 742 has a change of state due to a temperature excursion.

It should be apparent that the pulsed binary sample signal 716 resulting from the temperature excursion results in the held temperature signal 750 taking on a new value and therefore, the window defined by the boundaries of the positive offset held temperature signal 720 and the negative offset held temperature signal 726 taking one a new position surrounding the held temperature signal 750. Thus, the enable signal 742 changes back to its original state.

In this way, not only does a power up condition result in a temporary high state of the enable signal 742, but also a temperature excursion experienced by the temperature sensing element 744 results in a temporary high state of the enable signal 742. Thus, the enable signal 742 can cause any of the circuits described below to automatically calibrate (e.g., gain adjust) both at power up and when experiencing a predetermined temperature excursion, either a positive or a negative temperature excursion.

Figure 2:
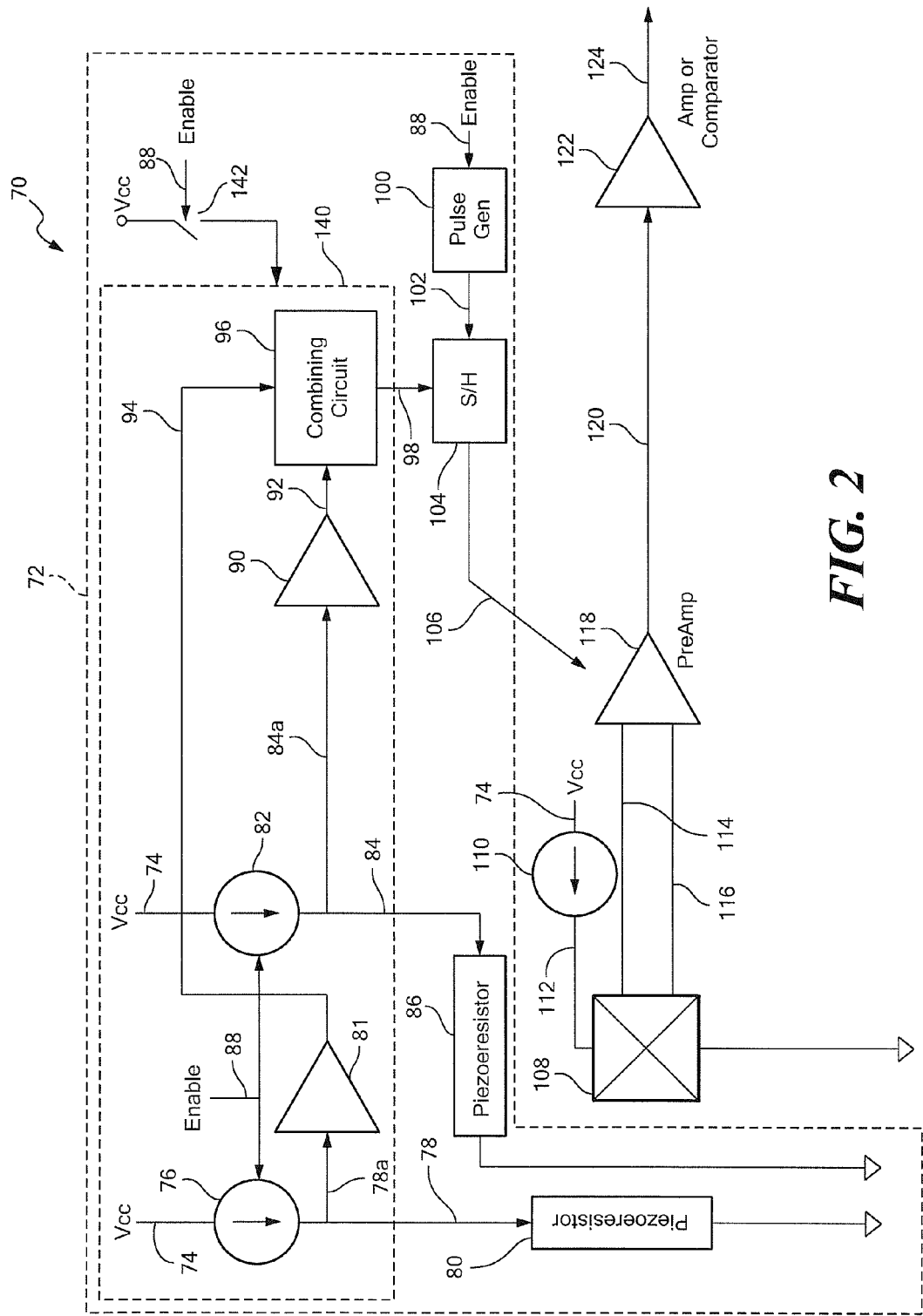
FIG. 2 is a block diagram of a particular embodiment of the circuit of FIG. 1, wherein the feedback circuit includes two piezoresistors, and wherein the gain adjustment circuit comprises a gain adjustable preamplifier.

Referring now to FIG. 2, a circuit 70 for sensing a magnetic field can be the same as or similar to the circuit 10 of FIG. 1 and can include a feedback circuit 72, which can be the same as or similar to the feedback circuit 12 of FIG. 1. The feedback circuit 72 is described more fully below.

The circuit 70 includes a magnetic field sensing element 108, here a Hall effect element. The Hall effect element 108 is coupled to receive a drive current signal 112 from a current source 110 and configured to generate a differential Hall voltage signal 114, 116, which is coupled to a preamplifier 118. The preamplifier 118 is used as a gain-adjustment element having a gain responsive to a gain-adjustment signal 106 generated by the feedback circuit 72. The preamplifier 118 is configured to amplify the differential input signal 114, 116 and to generate an amplified signal 120. The circuit 70 can also include another circuit element 122 coupled to receive the amplified signal 120 and configured to generate an output signal 124. In some arrangements, the circuit element 122 is a (linear) amplifier, and, in other arrangements, the circuit element 122 is a comparator.

The feedback circuit 72 can include first and second piezoresistors 80, 86, respectively. A piezoresistor will be recognized to be a circuit element having a resistance that varies in relation to a strain experienced by the piezoresistor. As described above, when a substrate over which the circuit 70 is disposed experiences a temperature excursion, or when the substrate experiences certain manufacturing processing steps, for example, overmolding with an integrated circuit body, the substrate can experience a stress and a resulting strain. The strain can affect a sensitivity of the magnetic field sensing element 108. As described more fully below, the feedback circuit 72, and the piezoresistors 80, 86 in particular, can measure the strain, and the feedback circuit 72 can generate the feedback signal 106 related to the strain.

The first piezoresistor 80 can be coupled to receive a first current signal 78 from a first current source 76, which results in a first voltage signal 78a. The feedback circuit 72 can also include a first amplifier 81 coupled to receive the first voltage signal 78a and configured to generate a first amplified signal 94.

Similarly, the second piezoresistor 86 can be coupled to receive a second current signal 84 from a second current source 82, which results in a second voltage signal 84a. The feedback circuit 72 can also include a second amplifier 90 coupled to receive the second voltage signal 84a and configured to generate a second amplified signal 92.

The feedback circuit 72 can further include a combining circuit 96 coupled to receive the first and second amplified signals 94, 92, respectively, and configured to generate an output signal 98. In some arrangements, the feedback circuit 72 includes a sample-and-hold circuit 104 coupled to receive the output signal 98. The sample-and-hold circuit 104 can be coupled to receive a pulse signal 102 from a pulse generator 100, a state or transition of which results in the sample-and-hold circuit 104 sampling the output signal 98 and generating the gain-control signal 106 accordingly. The pulse generator 100 can be responsive to an enable signal 88, which can be a temperature enable signal, a power-on enable signal, or a combination of both. To this end, the circuit 70 can include one or both of a temperature threshold circuit and/or a power-on circuit, which are described above in conjunction with FIGS. 1-1B. However, the temperature threshold circuit and/or a power-on circuit are not shown for clarity; instead, only the enable signal 88 is shown.

It should be apparent from the above discussion that the sample-and-hold circuit 104 can sample the output signal 98 to generate the gain-adjustment signal 106 during times when the temperature enable signal or the power-on enable signal are active, e.g., when the temperature of the circuit has increased above a temperature threshold or when power has recently been applied to the circuit 70. Conversely, the sample-and-hold circuit 104 can hold the gain-adjustment signal 106 during times when the temperature enable signal or the power-on enable signal are inactive, e.g., when the temperature decreases from being above the temperature threshold to being below the temperature threshold or at a time after power has been applied to the circuit 70.

The enable signal 88 can also be received by the first and second current sources 76, 82, respectively, causing the first and second current sources 76, 82 to generate the first and second current signals 78, 84 only when the enable signal 88 is active. With this arrangement, the circuit 70 can conserve power at times when gain adjustment is not required, for example, when the temperature of the circuit 70 has not exceeded the temperature threshold.

In some arrangements, the first and second piezoresistors 80, 86 are arranged orthogonally over the substrate on which they are disposed. With this arrangement, a value of the first voltage signal 78a is related to a strain in a first direction parallel to a major surface of the substrate and a value of the second voltage signal 84a is related to a strain in a second direction parallel to a major surface of the substrate and orthogonal to the first direction. With this arrangement, a strain of the substrate in any direction parallel to a major surface of the substrate can be sensed by the piezoresistors 80, 86.

In arrangements, a predetermined relationship between the first current signal 78 and the second current signal 84 is selected in accordance with an expected relationship between the strain of the substrate in the first direction and the strain of the substrate in the second direction when the substrate is subjected to a temperature excursion.

In some arrangements, the combining circuit 96 provides the output signal 98 and resulting gain-adjustment signal 106 as a sum of the amplified signals 94, 92. In other arrangements, the combining circuit 96 provides the output signal 98 and resulting gain-adjustment signal 106 as a root-mean-square (RMS) sum of the amplified signals 94, 92. In still other arrangements, particularly arrangements for which the sensitivity of the magnetic field sensing element 108 is a non-linear function of the strain of the substrate over which it is disposed, the combining circuit 96 can combine the amplified signals 94, 92 in other ways.

In operation, the gain-adjustment signal 106 adjusts the gain of the preamplifier 118 in relation to the strains sensed by the piezoresistors 80, 86, tending to keep the sensitivity of the circuit 70 more constant in the presence of strains and temperature excursions than if the gain-adjustment signal 106 were not provided. One of ordinary skill in the art will understand the relationship between strain of a substrate and the resulting effect upon the sensitivity of a Hall element disposed upon the substrate. One of ordinary skill in the art will also understand the relationship between temperature of a substrate and the resulting effect upon the sensitivity of a Hall element disposed upon the substrate.

A selected portion 140 of the feedback circuit 72 can be powered on or off, for example, by way of a switch 142, depending upon a state of the enable signal 88. Powering off the selected portion 140 can conserve power at times when gain adjustment is not required. It will be appreciated that the selected portion 140 excludes the sample-and-hold circuit 104 and the pulse generator 100. Thus, as described above, the sample-and-hold circuit 104 can hold the gain-adjustment signal 106 at a steady value during times when the temperature enable signal or the power-on enable signal (i.e., the enable signal 88) are inactive, e.g., when the temperature decreases from being above the temperature threshold to being below the temperature threshold or at a time after power has been applied to the circuit 70, even when the selected portion 140 is entirely powered off.

Figure 3:
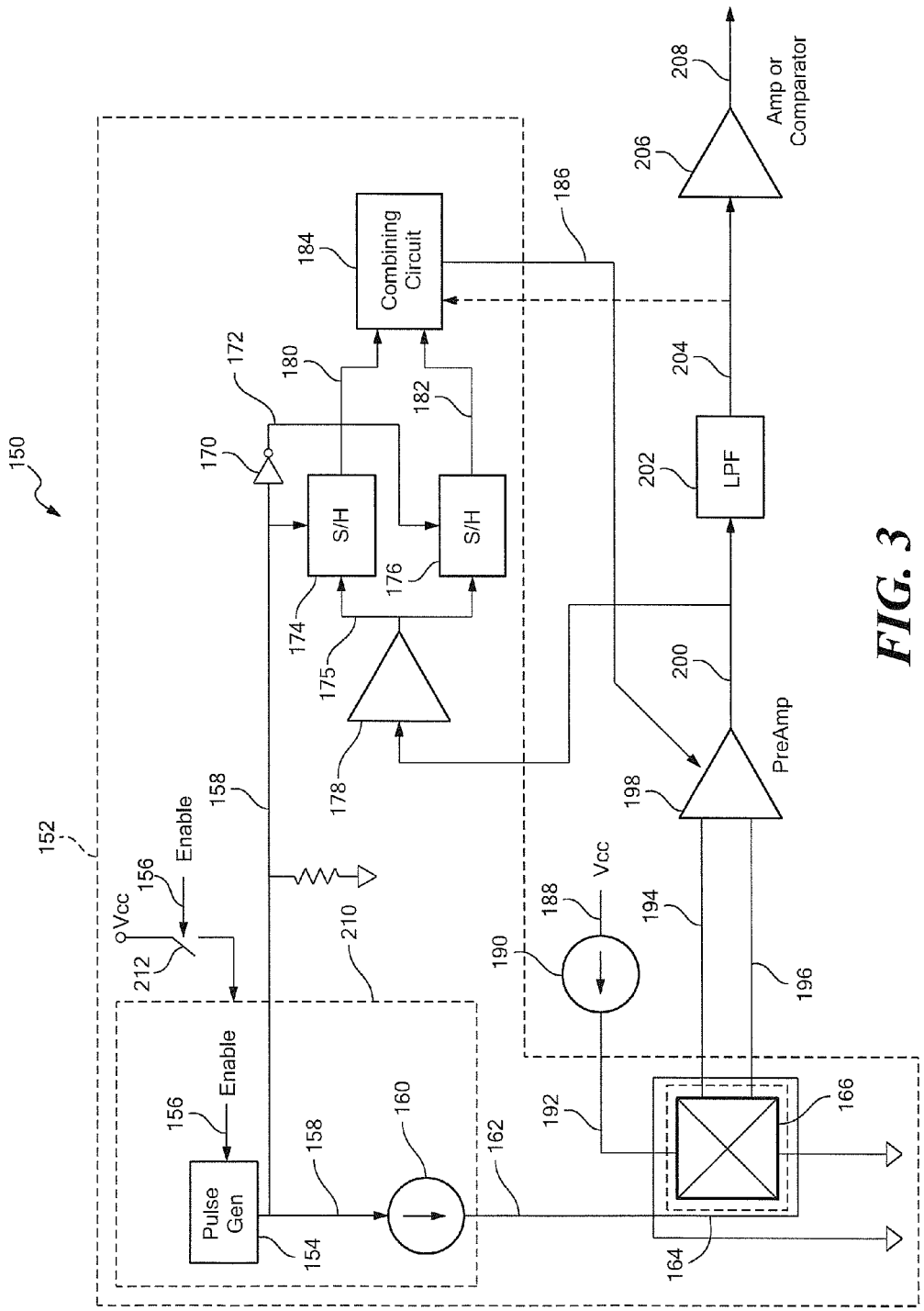
FIG. 3 is a block diagram of another particular embodiment of the circuit of FIG. 1, wherein the feedback circuit includes a conductor proximate to the Hall effect element, and wherein the gain adjustment circuit comprises a gain adjustable preamplifier.
Figure 3A:
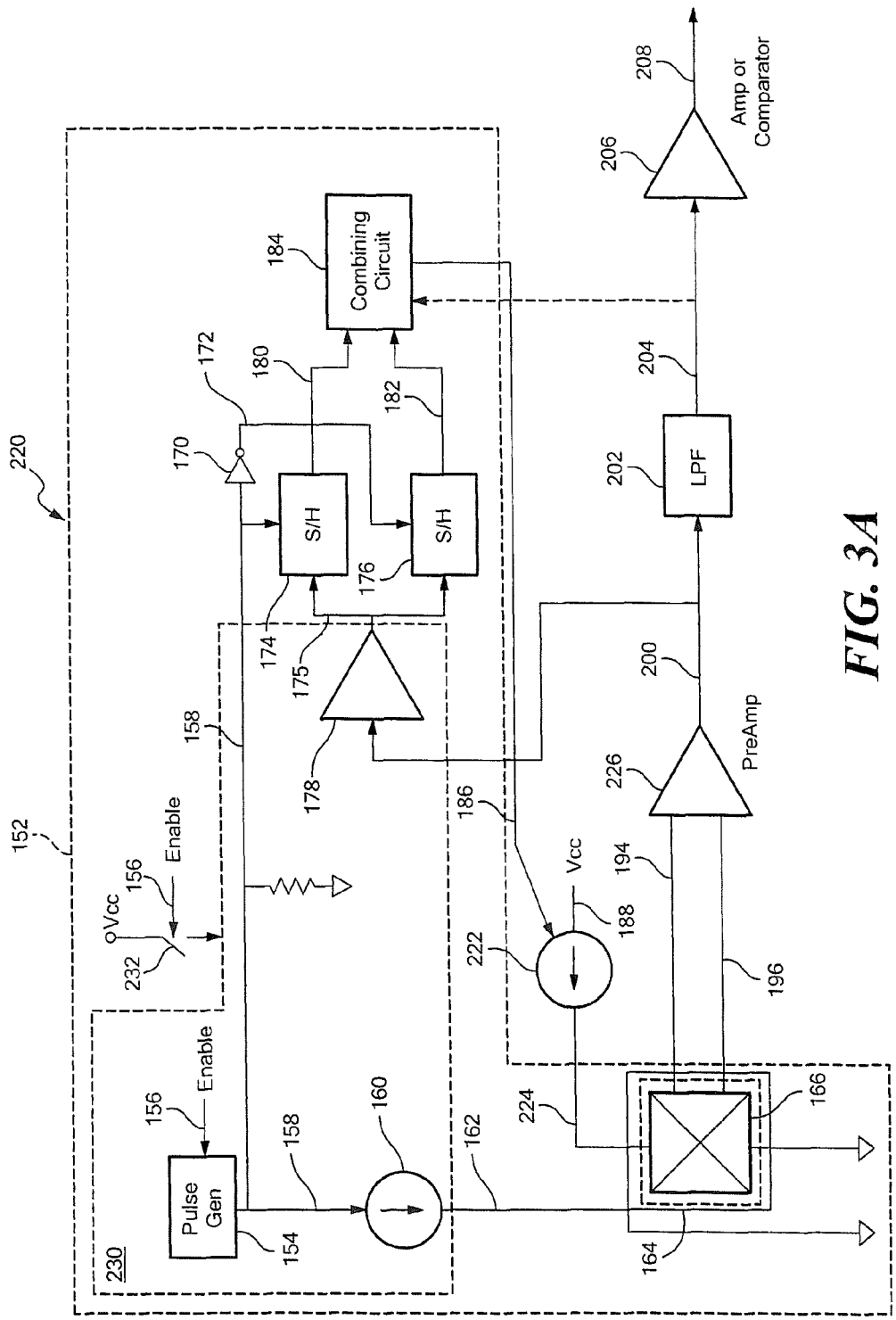
FIG. 3A is a block diagram of another particular embodiment of the circuit of FIG. 1, wherein the feedback circuit includes the conductor proximate to the Hall effect element, and wherein the gain adjustment circuit comprises an adjustable current source coupled to the Hall effect element.
Figure 3B:
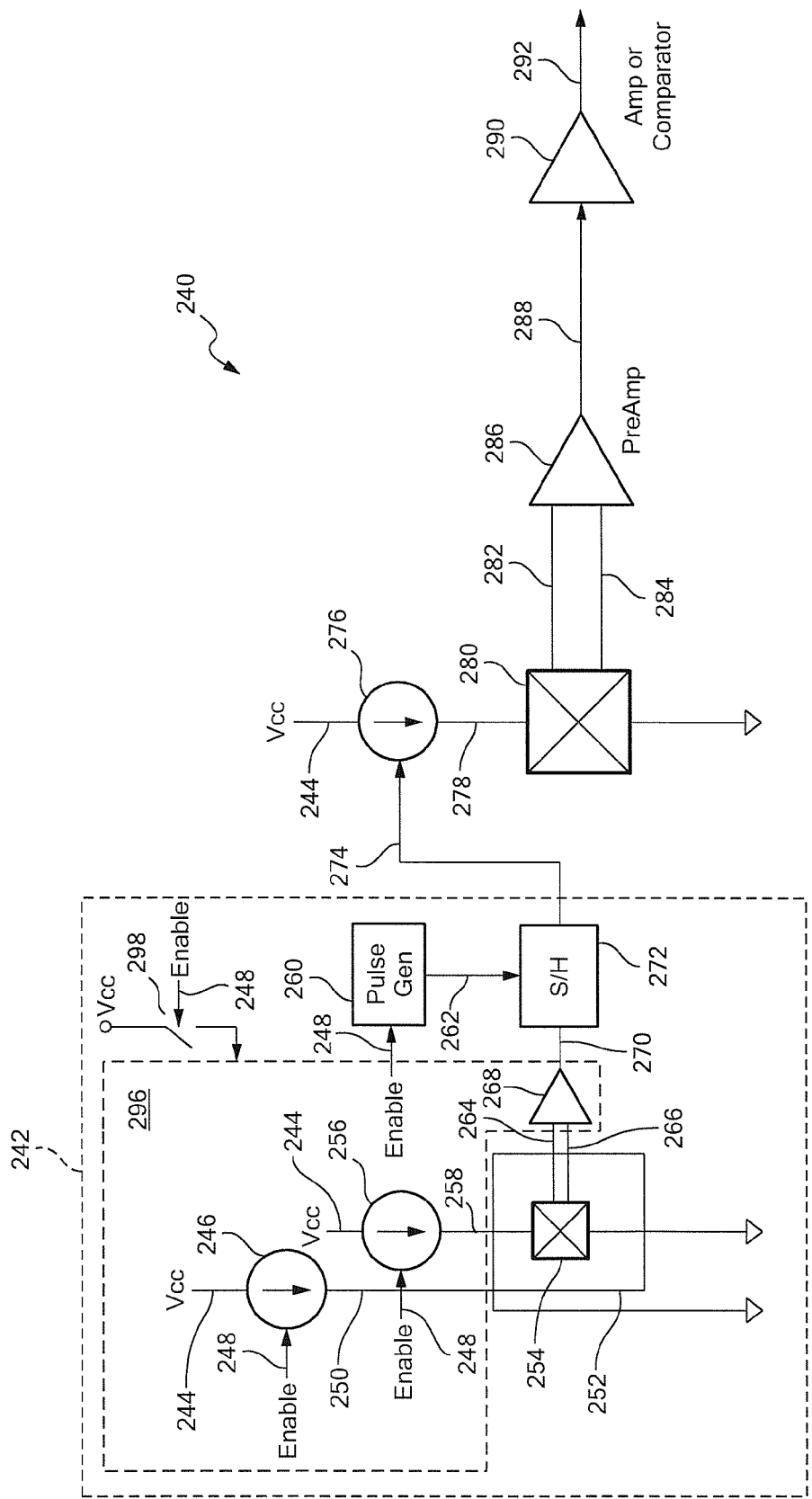
FIG. 3B is a block diagram of another particular embodiment of the circuit of FIG. 1, wherein the feedback circuit includes a second Hall effect element and wherein the gain adjustment circuit comprises an adjustable current source coupled to the Hall effect element.
Figure 4:
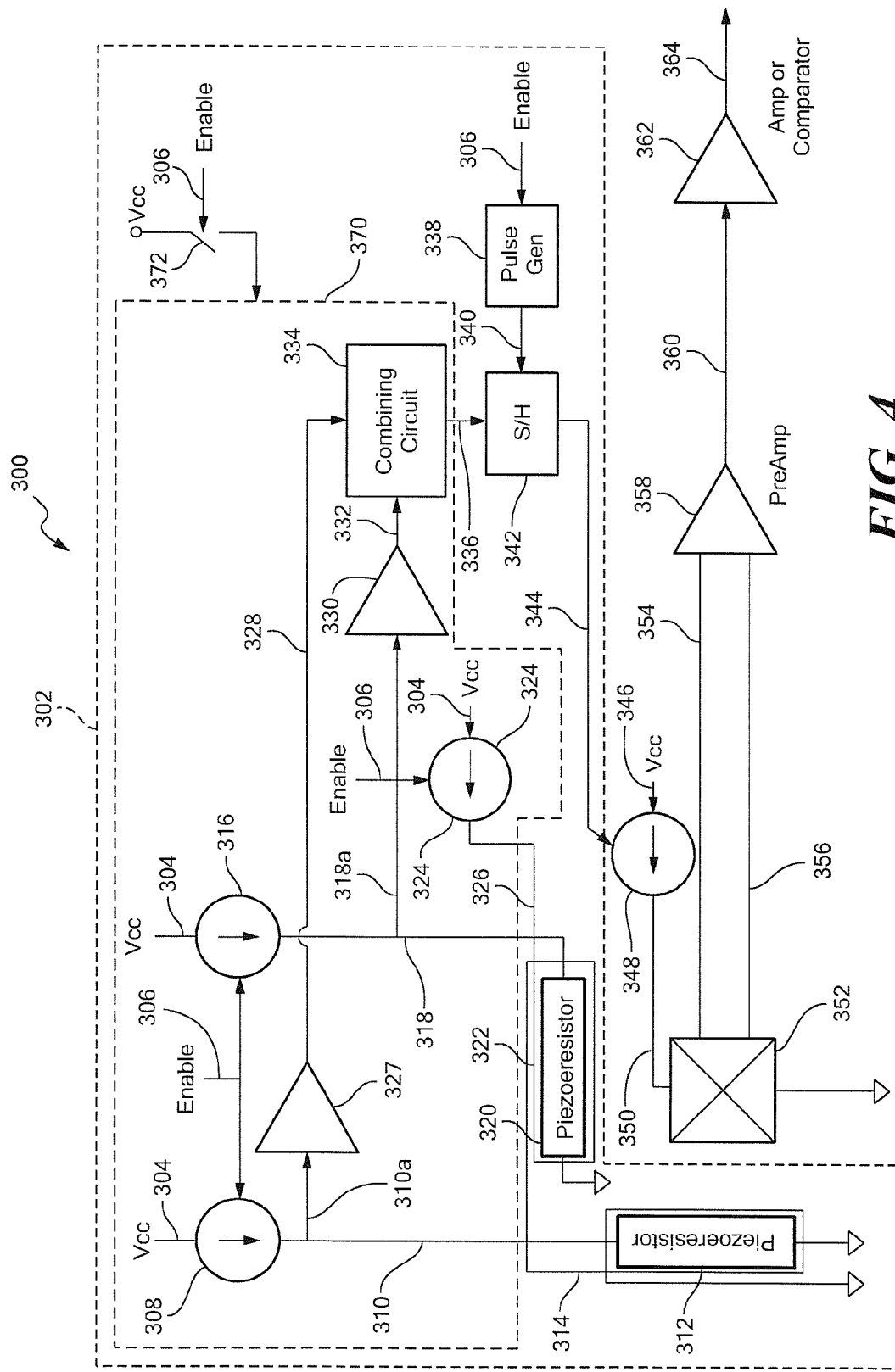
FIG. 4 is a block diagram of another particular embodiment of the circuit of FIG. 1, wherein the feedback circuit includes two piezoresistors and also includes a respective conductor proximate to each piezoresistor, and wherein the gain adjustment circuit comprises an adjustable current source coupled to the Hall effect element.
Figure 4A:
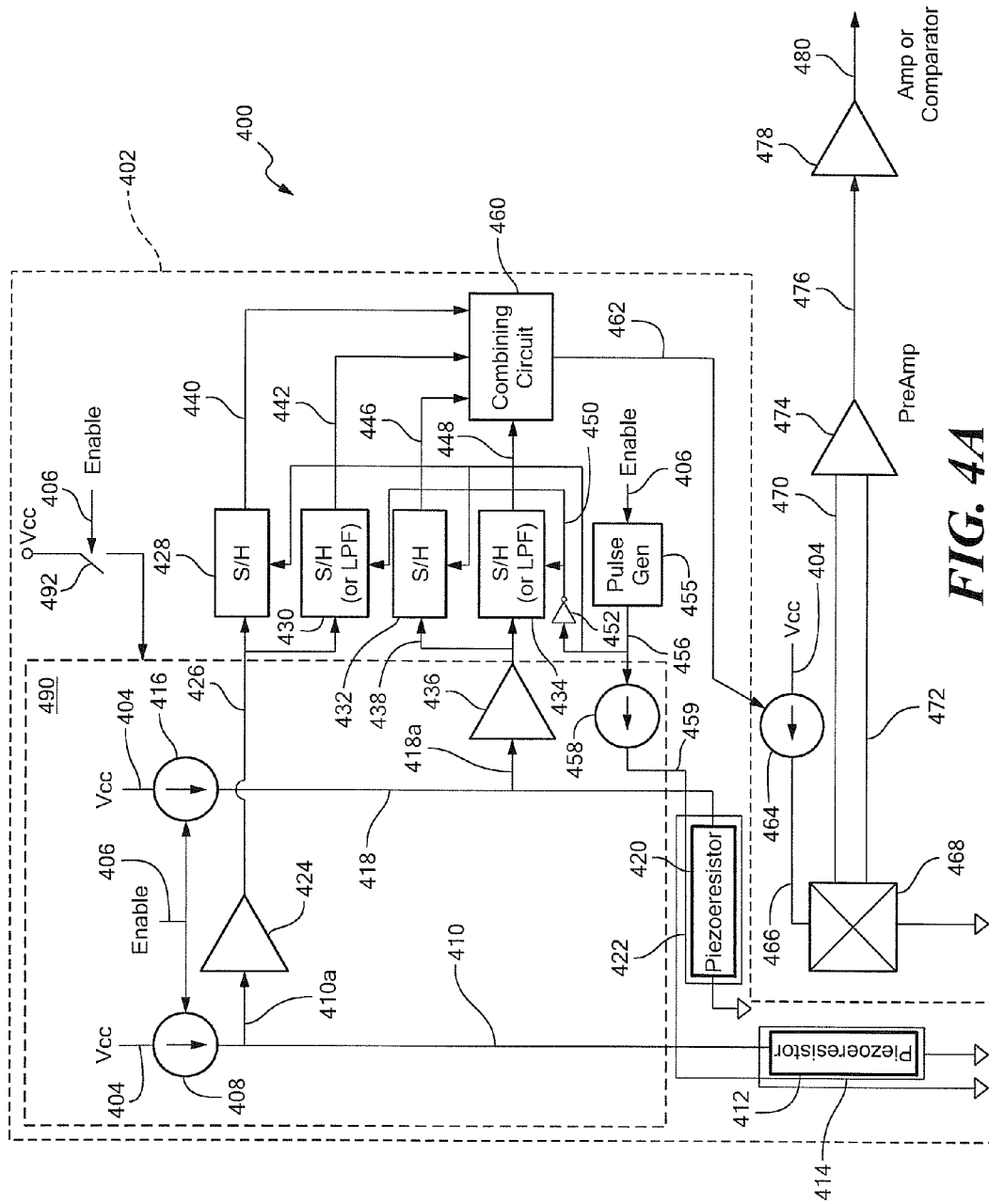
FIG. 4A is a block diagram of another particular embodiment of the circuit of FIG. 1, wherein the feedback circuit includes the two piezoresistors and also includes the respective conductor proximate to each piezoresistor, and wherein the gain adjustment circuit comprises the adjustable current source coupled to the Hall effect element.
Figure 4B:
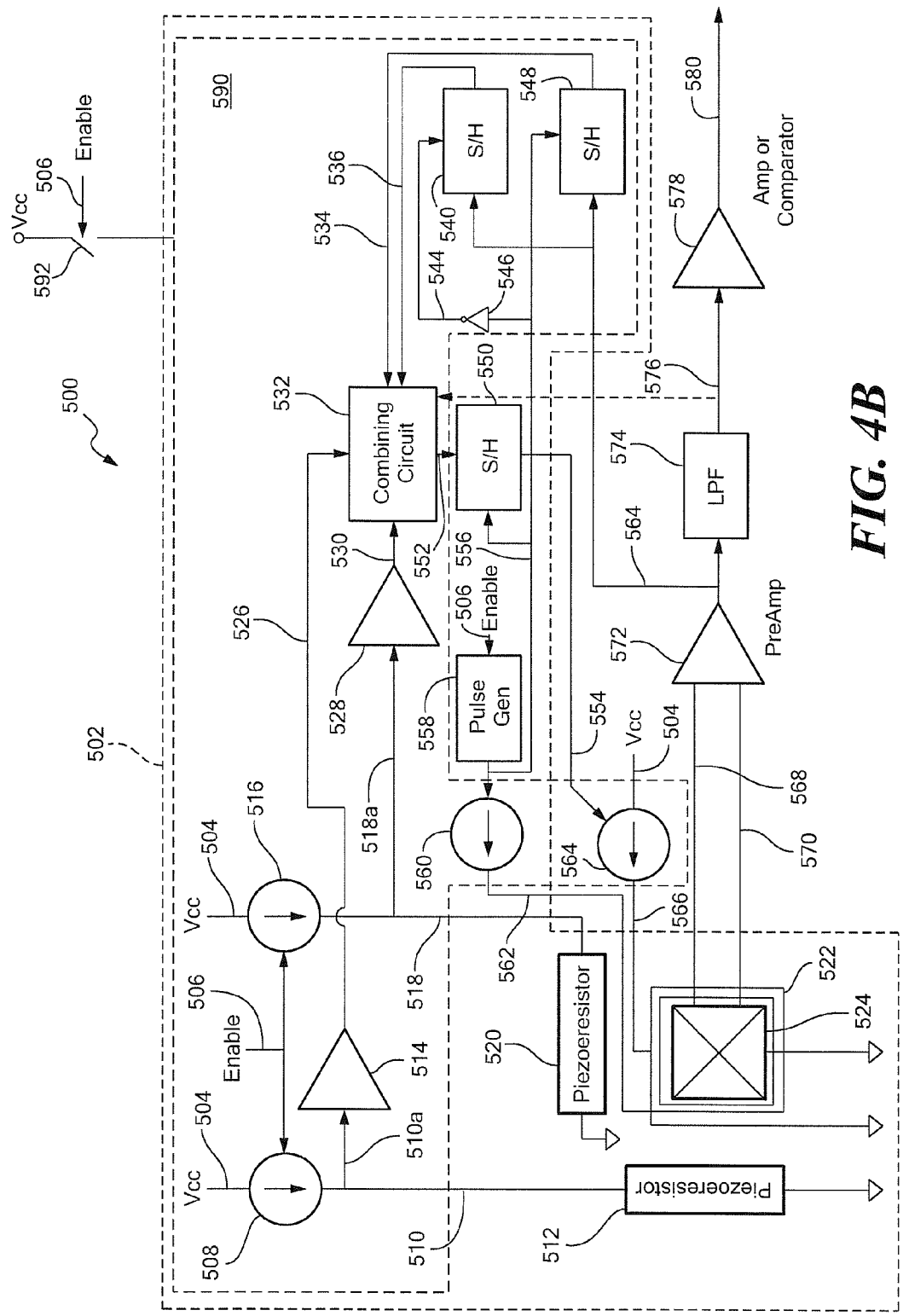
FIG. 4B is a block diagram of another particular embodiment of the circuit of FIG. 1, wherein the feedback circuit includes two piezoresistors and also includes a conductor proximate to the Hall effect element, and wherein the gain adjustment circuit comprises an adjustable current source coupled to the Hall effect element.

Similarly, a selected portion 210 and a switch 212 are shown in FIG. 3 below, a selected portion 230 and a switch 232 are shown in FIG. 3A below, a selected portion 296 and a switch 298 are shown in FIG. 3B below, a selected portion 370 and a switch 372 are shown in FIG. 4 below, a selected portion 490 and a switch 492 are shown in FIG. 4A below, and a selected portion 590 and a switch 592 are shown in FIG. 4B below, each of which can provide the functions and advantages of the selected portion 140 and the switch 142 of FIG. 2.

Figure 2A:
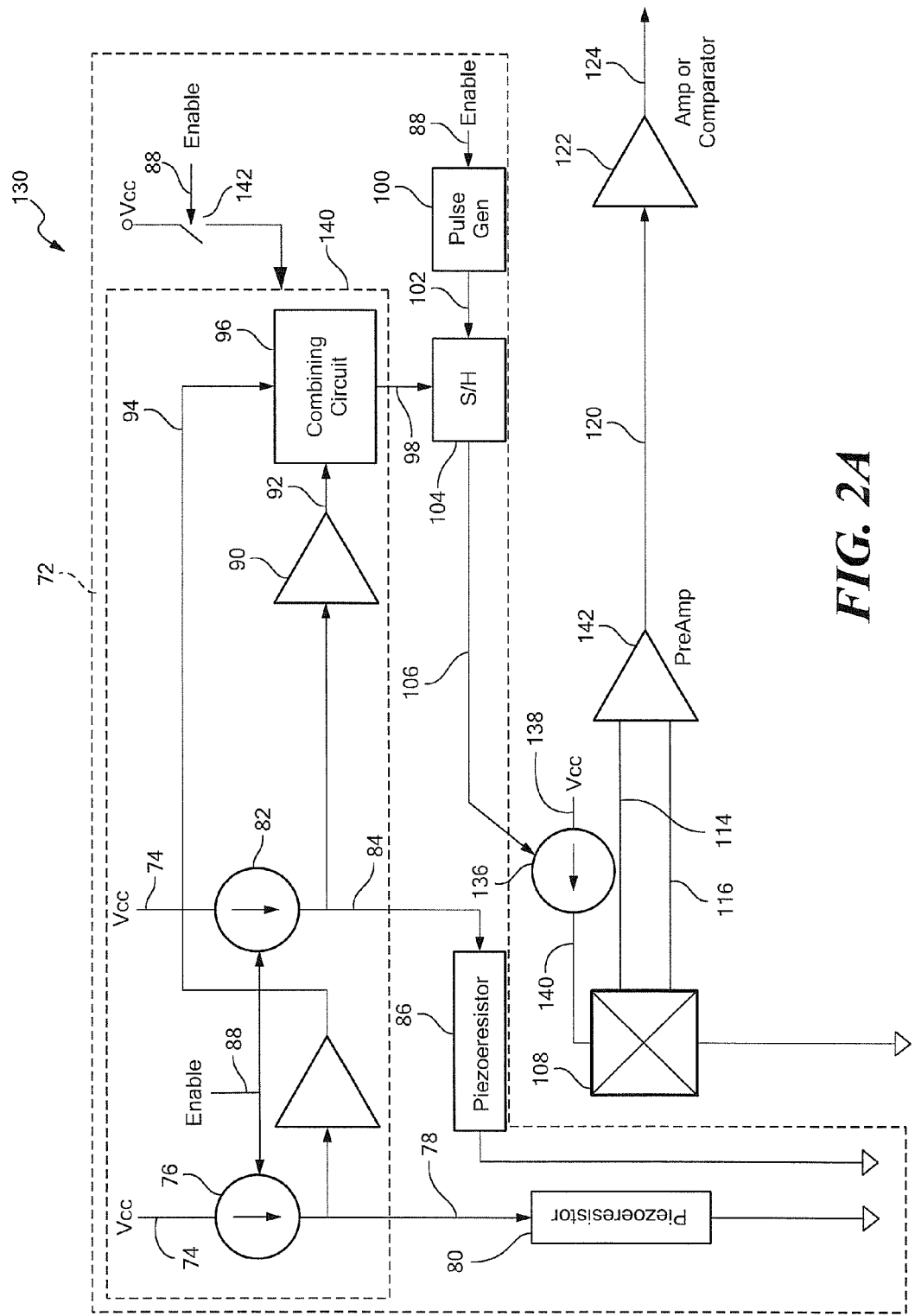
FIG. 2A is a block diagram of another particular embodiment of the circuit of FIG. 1, wherein the feedback circuit includes the two piezoresistors, and wherein the gain adjustment circuit comprises an adjustable current source coupled to the Hall effect element.

Referring now to FIG. 2A, in which like elements of FIG. 2 are shown having like reference designations, another circuit 130 for sensing a magnetic field can be the same as or similar to the circuit 10 of FIG. 1 and can include the feedback circuit 72 of FIG. 2. Unlike the circuit 70 of FIG. 2, gain adjustment is provided by way of an adjustable current source 136 that generates an adjustable current signal 140 to the Hall effect element 108 in response to the gain-adjustment signal 106. A fixed gain preamplifier 142 replaces the gain-adjustable preamplifier 118 of FIG. 2.

Operation of the circuit 130 is substantially the same as operation described above in conjunction with FIG. 2.

Referring now to FIG. 3, a circuit 150 for sensing a magnetic field can be the same as or similar to the circuit 10 of FIG. 1 and can include a feedback circuit 152, which can be the same as or similar to the feedback circuit 12 of FIG. 1. The feedback circuit 152 is described more fully below.

The circuit 150 includes a magnetic field sensing element 166, here a Hall effect element. The Hall effect element 166 is coupled to receive a drive current signal 192 from a current source 190 and configured to generate a differential Hall voltage signal 194, 196, which is coupled to a preamplifier 198. The preamplifier 198 is used as a gain-adjustment element having a gain responsive to a gain-adjustment signal 186 generated by the feedback circuit 152. The preamplifier 198 is configured to amplify the differential input signal 194, 196 and to generate an amplified signal 200. The circuit 150 can also include a low pass filter 202 coupled to receive the amplified signal 200 and configured to generate a filtered signal 204. The circuit 150 can also include another circuit element 206 coupled to receive the filtered signal 204 and configured to generate an output signal 208. In some arrangements, the circuit element 206 is a (linear) amplifier, and, in other arrangements, the circuit element 206 is a comparator.

The feedback circuit 152 can include a conductor 164, here shown to form a loop around the Hall effect element 166. The conductor 164 can be coupled to receive a current signal 162 from a current source 160. The current source 160 can be coupled to receive a pulse signal 158 generated by a pulse generator 154. The pulse signal 158 can result in a pulse current signal 162. In some arrangements, the pulse current signal has two states, a first state during which essentially zero current flows into the conductor 164, and a second state during which a predetermined current flows into the conductor 164. In some arrangements, a duty cycle of the second state can be small, for example, in the range of about one percent to about five percent. In some arrangements, a frequency of the pulse current signal 162 is in the range of about 25 kHz to 500 kHz.

It will be understood that, when the current source 160 is in the first state and generating essentially zero current, the Hall effect element 166 is responsive only to a magnetic field that it is intended to measure, for example, a magnetic field resulting from a current passing through a current-carrying conductor (or, more simple, a current conductor) as would be found in conjunction with a current sensor. However, when the current source 160 is in the second state and generating the predetermined current, the Hall effect element 166 is responsive not only to the magnetic field that it is intended to measure, but also to a magnetic field generated by the predetermined current passing through the conductor 164. Therefore, the amplified signal 200 is a sum of a signal representative of the magnetic field that the circuit 150 is intended to measure combined with pulses representative of the magnetic field resulting from current signal 162 having the above-described current pulses.

The amplified signal 200 is received by an amplifier 178 configured to generate another amplified signal 175. First and second sample-and-hold circuits 174, 178, respectively, are coupled to receive the amplified signal 175 and to generate first and second sampled signals 180, 192, respectively. The first sample-and-hold circuit 174 receives the pulse signal 158 and samples during a particular state of the pulse signal 158, for example, at times when the current signal 162 has a current pulse. The second sample-and-hold circuit 176 receives an inverted pulse signal 172 generated by an inverter 170 and samples during a particular state of the inverted pulse signal 172, for example, at times when the current signal 162 has no current pulse. It should be appreciated that the second sampled signal 182 is representative of the magnetic field that the circuit 150 is intended to measure, while the first sampled signal 180 is representative of the magnetic field that the circuit 150 is intended to measure in combination with the magnetic field resulting from current signal 162 having the above-described current pulses.

The feedback circuit 152 can include a combining circuit 184 coupled to receive the first and second sampled signals 180, 182. The combining circuit 184 is configured to generate the gain-adjustment signal 186 coupled to the preamplifier 198. In some arrangements, the combining circuit 184 provides the gain-adjustment signal 186 as a difference of the first and second sampled signals 180, 182, and is, therefore, representative of only the magnetic field resulting from current signal 162 having the above-described current pulses. With this particular arrangement, it should be understood that the gain-adjustment signal 186 is directly representative of a sensitivity of the Hall effect element 166 to the magnetic field resulting from the above-described current pulses.

As used herein, the term "gain-calculation circuit" is used to describe portions of the feedback circuit 152 not including the conductor 164, current source 160, or pulse generator 154.

The low pass filter 202 essentially removes the pulses in the amplified signal 200 resulting from the above-described current pulses, leaving the filtered signal 204 representative of only the magnetic field that the circuit 150 is intended to measure. It will be understood that the filtered signal 204 is similar to the second sampled signal 182, and in other embodiments, either signal can be used interchangeably. Thus, the signal 204 is shown to be coupled with a dashed line to the combining circuit 184.

In operation, the gain-adjustment signal 186 adjusts the gain of the preamplifier 198 in relation to the directly measured sensitivity of the Hall effect element 164, tending to keep the sensitivity of the circuit 150 more constant in the presence of strain-related changes in the sensitivity of the Hall effect element 166, or other changes in the sensitivity of the Hall effect element 166, than if the gain-adjustment signal 186 were not provided.

It will be appreciated that the sensitivity of the Hall effect element 166 can be directly affected by temperature, apart from the strains imposed upon Hall effect element 166 due to the temperature. For example, mobility of the Hall effect element can be related to temperature. Since the circuit 150 directly measures the sensitivity of the Hall effect element 166, the circuit 150 is configured to adjust the gain of the preamplifier 198 to account for changes in sensitivity of the Hall effect element 166 resulting from any source of change.

The pulse generator 154 can be coupled to receive an enable signal 156, which, as described above in conjunction with FIG. 2, can be a temperature enable signal, a power-on enable signal, or a combination of both. To this end, the circuit 150 can include one or both of a temperature threshold circuit and/or a power-on circuit, which are described above in conjunction with FIGS. 1-1B. However, the temperature threshold circuit and/or a power-on circuit are not shown for clarity; instead, only the enable signal 156 is shown.

Referring now to FIG. 3A, in which like elements of FIG. 3 are shown having like reference designations, another circuit 220 for sensing a magnetic field can be the same as or similar to the circuit 10 of FIG. 1 and can include the feedback circuit 152 of FIG. 3. Unlike the circuit 150 of FIG. 3, gain adjustment is provided by way of an adjustable current source 222 that generates an adjustable current signal 224 to the Hall effect element 166 in response to the gain-adjustment signal 186. A fixed gain preamplifier 226 replaces the gain-adjustable preamplifier 198 of FIG. 3.

Operation of the circuit 220 is substantially the same as operation described above in conjunction with FIG. 3.

Referring now to FIG. 3B, a circuit 240 for sensing a magnetic field, like the circuit 150 of FIG. 3, achieves a gain adjustment by a direct measurement of a sensitivity of a Hall effect element. However, unlike the circuit 150, the element used to directly measure the sensitivity is a second Hall effect element 254, not the Hall effect element 280 intended to measure a magnetic field.

The circuit 240 can include a feedback circuit 242, which can be the same as or similar to the feedback circuit 12 of FIG. 1. The feedback circuit 242 is described more fully below.

The circuit 240 includes a magnetic field sensing element 280, here a Hall effect element. The Hall effect element 280 is coupled to receive a drive current signal 278 from a current source 276 and configured to generate a differential Hall voltage signal 282, 284, which is coupled to a preamplifier 286. The preamplifier 286 is configured to generate an amplified signal 288. The circuit 240 can also include another circuit element 290 coupled to receive the amplified signal 288 and configured to generate an output signal 290. In some arrangements, the circuit element 290 is a (linear) amplifier, and, in other arrangements, the circuit element 290 is a comparator.

The feedback circuit 242 can include a secondary magnetic field sensing element 254, here a Hall effect element. The secondary Hall effect element 254 is coupled to receive a drive current signal 258 from a current source 256 and configured to generate a differential Hall voltage signal 264, 266, which is coupled to a second preamplifier 268. A current conductor 252, here shown as a coil, is proximate to the secondary Hall effect element 254. The current conductor 252 receives a current signal 250 from a current source 246. The differential Hall voltage signal 264, 266 is representative of a magnetic field generated by the current conductor 252 and of a sensitivity of the second Hall effect element 254. In some arrangements, the circuit 240 includes a magnetic shield disposed proximate to the second Hall effect element 254 to reduce the effect upon the secondary Hall effect element 254 of magnetic fields other than the magnetic field generated by the current conductor 252.

The second preamplifier 268 is configured to generate an amplified signal 270. The feedback circuit 242 can include a sample-and-hold circuit 272 coupled to receive the amplified signal 270 and configured to generate a gain-adjustment signal 274. The current source 276 generates the current signal 278 as an adjustable current signal 278 to the Hall effect element 280 in response to the gain-adjustment signal 274.

In operation, the gain-adjustment signal 274 adjusts the current source 276, tending to keep the sensitivity of the circuit 240 more constant in the presence of changes in the sensitivity of the secondary Hall effect element 254, which are related to changes in sensitivity of the Hall effect element 280, than if the gain-adjustment signal 274 were not provided.

The pulse generator 260 can be coupled to receive an enable signal 248, which, as described above in conjunction with FIG. 2, can be a temperature enable signal, a power-on enable signal, or a combination of both. To this end, the circuit 240 can include one or both of a temperature threshold circuit and/or a power-on circuit, which are described above in conjunction with FIGS. 1-1B. However, the temperature threshold circuit and/or a power-on circuit are not shown for clarity; instead, only the enable signal 248 is shown.

The enable signal 248 can also be received by the first and second current sources 246, 256, respectively, causing the first and second current sources 246, 256 to generate the first and second current signals 250, 258 only when the enable signal 248 is active, i.e., in a particular state. With this arrangement, the circuit 240 can conserve power at times when gain adjustment is not required, for example, when the temperature of the circuit 240 has not exceeded the temperature threshold.

While the feedback circuit 242 is shown to control the gain associated with the Hall effect element 280 by way of the current source 276, in other embodiments, the gain-adjustment signal 274 can be applied to a gain-adjustable preamplifier in place of the preamplifier 286.

Referring now to FIG. 4, a circuit 300 for sensing a magnetic field can be the same as or similar to the circuit 10 of FIG. 1 and can include a feedback circuit 302, which can be the same as or similar to the feedback circuit 12 of FIG. 1. The feedback circuit 302 is described more fully below.

The circuit 300 includes a magnetic field sensing element 352, here a Hall effect element. The Hall effect element 352 is coupled to receive a drive current signal 350 from an adjustable current source 348 and configured to generate a differential Hall voltage signal 354, 356, which is coupled to a preamplifier 358. The adjustable current source 348 is responsive to a gain-adjustment signal 344 generated by the feedback circuit 302 and provides a gain adjustment of the differential Hall voltage signal 354, 356. The preamplifier 358 is configured to generate an amplified signal 360. The circuit 300 can also include another circuit element 362 coupled to receive the amplified signal 360 and configured to generate an output signal 364. In some arrangements, the circuit element 362 is a (linear) amplifier, and, in other arrangements, the circuit element 362 is a comparator.

The feedback circuit 302 can include first and second piezoresistors 312, 320, respectively. As described above, when a substrate over which the circuit 300 is disposed experiences a temperature excursion, or when the substrate experiences certain manufacturing processing steps, for example, overmolding with an integrated circuit body, the substrate can experience a stress and a resulting strain. The strain can affect a sensitivity of the magnetic field sensing element 352. As described more fully below, the feedback circuit 302, and the piezoresistors 312, 320 in particular, can measure the strain, and the feedback circuit 302 can generate the feedback signal 344 related to the strain.

The first piezoresistor 312 can be coupled to receive a first current signal 310 from a first current source 308, which results in a first voltage signal 310*a*. The feedback circuit 302 can also include a first amplifier 327 coupled to receive the first voltage signal 310*a* and configured to generate a first amplified signal 328.

Similarly, the second piezoresistor 320 can be coupled to receive a second current signal 318 from a second current source 316, which results in a second voltage signal 318*a*. The feedback circuit 302 can also include a second amplifier 330 coupled to receive the second voltage signal 318*a* and configured to generate a second amplified signal 332.

Unlike the circuit 70 of FIG. 2, the circuit 300 can further include series coupled first and second conductors 314, 322, respectively, here shown as coils, proximate to the first and second piezoresistors 312, 320. It will be recognized that piezoresistors, which are primarily responsive to strains, are also responsive to magnetic fields. To this end, the conductors 314, 322 are coupled to receive a current signal 326 from a current source 324. The current signal 326 passing through the conductors 314, 322 results in a magnetic field at the piezoresistors 312, 320. Therefore, it should be appreciated that the first and second amplified signals 328, 332 are indicative of strains experienced by the first and second piezoresistors 312, 320 respectively, (e.g., have voltages that vary in proportion to the respective strains), and are also indicative of magnetic field responses (i.e., sensitivity) of the first and second piezoresistors 312, 320, respectively, (e.g., have voltages that vary in proportion to the current signal 326). It should be understood that changes in the magnetic field sensitivity of the first and second piezoresistors 312, 320 tend to be related to changes in the magnetic field sensitivity of the magnetic field sensing element 352. The circuit 300 tends to more directly measure changes in magnetic field sensitivity than the circuit 70 of FIG. 2.

The feedback circuit 302 can further include a combining circuit 334 coupled to receive the first and second amplified signals 328, 332, respectively, and configured to generate an output signal 336. In some arrangements, the feedback circuit 302 includes a sample-and-hold circuit 342 coupled to receive the output signal 336. The sample-and-hold circuit 342 can be coupled to receive a pulse signal 340 from a pulse generator 338, a state or transition of which results in the sample-and-hold circuit 342 sampling the output signal 336 and generating the gain-control signal 344 accordingly. The pulse generator 338 can be responsive to an enable signal 306, which can be a temperature enable signal, a power-on enable signal, or a combination of both. To this end, the circuit 300 can include one or both of a temperature threshold circuit and/or a power-on circuit, which are described above in conjunction with FIGS. 1-1B. However, the temperature threshold circuit and/or a power-on circuit are not shown for clarity; instead, only the enable signal 306 is shown.

It should be apparent from the above discussion that the sample-and-hold circuit 342 can sample the output signal 336 to generate the gain-adjustment signal 344 during times when the temperature enable signal or the power-on enable signal are active, e.g., when the temperature of the circuit has increased above a temperature threshold or when power has recently been applied to the circuit 300. Conversely, the sample-and-hold circuit 342 can hold the gain-adjustment signal 344 during times when the temperature enable signal or the power-on enable signal are inactive, e.g., when the temperature decreases from being above the temperature threshold to being below the temperature threshold or at a time after power has been applied to the circuit 300.

The enable signal 306 can also be received not only by the pulse generator 306, but also by the first and second current sources 308, 316, respectively, and also by the current source 324, causing the first and second current sources 308, 316 and also the current source 324 to generate the first and second current signals 310, 318 and also the current signal 326 only when the enable signal 306 is active, i.e., in a particular state. With this arrangement, the circuit 300 can conserve power at times when gain adjustment is not required, for example, when the temperature of the circuit 300 has not exceeded the temperature threshold.

In some arrangements, the first and second piezoresistors 312, 320 are arranged orthogonally over the substrate on which they are disposed. With this arrangement, a value of the first voltage signal 310*a* is related to a strain in a first direction parallel to a major surface of the substrate and a value of the second voltage signal 318*a* is related to a strain in a second direction parallel to a major surface of the substrate and orthogonal to the first direction. With this arrangement, a strain of the substrate in any direction parallel to a major surface of the substrate can be sensed by the piezoresistors 312, 320.

In some arrangements, the combining circuit 334 provides the output signal 336 and resulting gain-adjustment signal 344 as a sum of the amplified signals 328, 332. In other arrangements, the combining circuit 334 provides the output signal 336 and resulting gain-adjustment signal 344 as a root-mean-square (RMS) sum of the amplified signals 328, 332. In still other arrangements, particularly arrangements for which the sensitivity of the magnetic field sensing element 352 is a non-linear function of the strain of the substrate over which it is disposed, the combining circuit 334 can combine the amplified signals 328, 332 in other ways.

In operation, the gain-adjustment signal 344 adjusts the current signal 350, and therefore, the sensitivity of the Hall effect element 352 in relation to the strains sensed by the first and second piezoresistors 312, 320, and also in relation to magnetic field sensitivity of the first and second piezoresistors 312, 320, tending to keep the sensitivity of the circuit 300 more constant in the presence of strains and the temperature excursions than if the gain-adjustment signal 344 were not provided.

While the feedback circuit 302 is shown to control the gain associated with the Hall effect element 352 by way of the current source 348, in other embodiments, the gain-adjustment signal 344 can be applied to a gain-adjustable preamplifier in place of the preamplifier 358.

While the conductors 314, 322 are shown to be coupled in series and driven by the current source 324, in other arrangements, the conductors 314, 322 are driven in parallel by the current source 324. In still other arrangements, the conductors 314, 322 are separately driven by separate current sources.

In some arrangements the circuit 300 has only one of the current-carrying conductors 314, 322.

Referring now to FIG. 4A, a circuit 400 for sensing a magnetic field is similar to the circuit 300 of FIG. 4, but operates upon signals generated by piezoresistors in a different way. The circuit 400 can be the same as or similar to the circuit 10 of FIG. 1 and can include a feedback circuit 402, which can be the same as or similar to the feedback circuit 12 of FIG. 1. The feedback circuit 402 is described more fully below.

The circuit 400 includes a magnetic field sensing element 468, here a Hall effect element. The Hall effect element 468 is coupled to receive a drive current signal 466 from an adjustable current source 464 and configured to generate a differential Hall voltage signal 470, 472, which is coupled to a preamplifier 474. The adjustable current source 464 is responsive to a gain-adjustment signal 462 generated by the feedback circuit 402 and provides a gain adjustment of the differential Hall voltage signal 470, 472. The preamplifier 474 is configured to generate an amplified signal 476. The circuit 400 can also include another circuit element 478 coupled to receive the amplified signal 476 and configured to generate an output signal 480. In some arrangements, the circuit element 478 is a (linear) amplifier, and, in other arrangements, the circuit element 478 is a comparator.

The feedback circuit 402 can include first and second piezoresistors 412, 420, respectively. The first piezoresistor 412 can be coupled to receive a first current signal 410 from a first current source 408, which results in a first voltage signal 410a. The feedback circuit 402 can also include a first amplifier 424 coupled to receive the first voltage signal 410a and configured to generate a first amplified signal 426.

Similarly, the second piezoresistor 420 can be coupled to receive a second current signal 418 from a second current source 416, which results in a second voltage signal 418a. The feedback circuit 402 can also include a second amplifier 436 coupled to receive the second voltage signal 418a and configured to generate a second amplified signal 438.

Unlike the circuit 70 of FIG. 2, but like the circuit 300 of FIG. 4, the circuit 400 can further include series coupled first and second conductors 414, 422, respectively, here shown as coils, proximate to the first and second piezoresistors 412, 420. It will be recognized that piezoresistors, which are primarily responsive to strains, are also responsive to magnetic fields. To this end, the conductors 414, 422 are coupled to receive a current signal 459 from a current source 458. Unlike the current signal 346 of FIG. 4, the current signal 459 is a pulsed current signal responsive to a pulse generator 455. The current signal 459 passing through the conductors 414, 422 results in a magnetic field at the piezoresistors 412, 420. Therefore, it should be appreciated that the first and second amplified signals 426, 438 are indicative of strains experienced by the first and second piezoresistors 412, 420, respectively, and also are indicative of magnetic field responses of the first and second piezoresistors 312, 320, respectively. As described above in conjunction with FIG. 4, it should be understood that changes in the magnetic field sensitivity of the first and second piezoresistors 412, 420 tends to be related to changes in the magnetic field sensitivity of the magnetic field sensing element 468. The circuit 400 tends to more directly measure changes in magnetic field sensitivity than the circuit 70 of FIG. 2.

The feedback circuit 402 can further include first and second sample-and-hold circuits 428, 430, respectively, coupled to receive the first amplified signal 426 and also third and fourth sample-and-hold circuits 432, 434, respectively, coupled to receive the second amplified signal 438. The first sample-and-hold circuit 428 generates a first sampled signal 440, the second sample-and-hold circuit 430 generates a second sampled signal 442, the third sample-and-hold circuit 432 generates a third sampled signal 446, and the fourth sample-and-hold circuit 434 generates a fourth sampled signal 448, each received by a combining circuit 460.

The first and third sample-and-hold circuits 428, 432, sample at times when the current signal 459 has a value equal to a pulse current. Therefore, the first and third sampled signals 440, 446 are indicative of strains experienced by the first and second piezoresistors 412, 420, respectively, and also are indicative of the magnetic response of the first and second piezoresistors 412, 420 to the magnetic field generated by the pulsed current signal 459 (and also to any other magnetic field that may be present).

The second and fourth sample-and-hold circuits 430, 434 sample at times when the current signal 459 has a value of substantially zero. Therefore, the second and fourth sampled signals 442, 448 are generally indicative of only strains experienced by the first and second piezoresistors 412, 420, respectively. However, the second and fourth sampled signal 442, 448 can also be indicative of any other magnetic fields that may be present. The second and fourth sampled signals 442, 448 represent a baseline, which can be subtracted from the first and third sampled signals 440, 446 in order to achieve a signal representative of only the magnetic field response of the first and second piezoresistors 412, 420 to the magnetic field generated by the pulsed current signal 459 (and also to any other magnetic field that may be present).

The combining circuit 460 is configured to generate the gain-adjustment signal 462. The pulse generator 455 can be responsive to an enable signal 406, which can be a temperature enable signal, a power-on enable signal, or a combination of both. To this end, the circuit 300 can include one or both of a temperature threshold circuit and/or a power-on circuit, which are described above in conjunction with FIGS. 1-1B. However, the temperature threshold circuit and/or a power-on circuit are not shown for clarity; instead, only the enable signal 406 is shown.

It should be apparent from the above discussion that by way of the enable signal 406 received by the pulse generator 455, the sample-and-hold circuits 428, 430, 432, 434 can sample to generate the gain-adjustment signal 462 during times when the temperature enable signal or the power-on enable signal are active, e.g., when the temperature of the circuit has increased above a temperature threshold or when power has recently been applied to the circuit 400. Conversely, the sample-and-hold circuits 428, 430, 432, 434 can hold the gain-adjustment signal 462 during times when the temperature enable signal or the power-on enable signal are inactive, e.g., when the temperature decreases from being above the temperature threshold to being below the temperature threshold or at a time after power has been applied to the circuit 400.

The enable signal 406 can also be received by the first and second current sources 408, 416, respectively, causing the first and second current sources 408, 416 to generate the first and second current signals 410, 418 (and also the current signal 459) only when the enable signal 406 is active, i.e., in a particular state. With this arrangement, the circuit 400 can conserve power at times when gain adjustment is not required, for example, when the temperature of the circuit 400 has not exceeded the temperature threshold.

In some arrangements, the first and second piezoresistors 412, 420 are arranged orthogonally over the substrate on which they are disposed. With this arrangement, a value of the first voltage signal 410a is related to a strain in a first direction parallel to a major surface of the substrate and a value of the second voltage signal 418a is related to a strain in a second direction parallel to a major surface of the substrate and orthogonal to the first direction. With this arrangement, a strain of the substrate in any direction parallel to a major surface of the substrate can be sensed by the piezoresistors 412, 420.

In some arrangements, the combining circuit 460 provides the gain-adjustment signal 462 related to a sum of the first and third sampled signals 440, 446. In some arrangements, the combining circuit 460 subtracts a sum of the second and fourth sampled signal 442, 448 from the sum of the first and third sampled signals 440, 446.

In other arrangements, the combining circuit 460 provides the gain-adjustment signal 462 related to a root-mean-square (RMS) sum of the first and third sampled signals 440, 446. In some arrangements, the combining circuit 460 subtracts an RMS sum of the second and fourth sampled signal 442, 448 from the RMS sum of the first and third sampled signals 440, 446.

In still other arrangements, particularly arrangements for which the sensitivity of the magnetic field sensing element 468 is a non-linear function of the strain of the substrate over which it is disposed, the combining circuit 460 can combine the first, second, third and fourth sampled signals 440, 442, 446, 448 in other ways.

In operation, the gain-adjustment signal 462 adjusts the current signal 446, and therefore, the sensitivity of the Hall effect element 468 in relation to the strains sensed by the first and second piezoresistors 412, 420, and also in relation to magnetic field sensitivity of the first and second piezoresistors 412, 420, tending to keep the sensitivity of the circuit 400 more constant in the presence of the strains and the temperature excursions than if the gain-adjustment signal 462 were not provided.

While the feedback circuit 402 is shown to control the gain associated with the Hall effect element 468 by way of the current source 464, in other embodiments, the gain-adjustment signal 462 can be applied to a gain-adjustable preamplifier in place of the preamplifier 474.

In some arrangements the circuit 400 has only one of the current-carrying conductors 414, 422.

Referring now to FIG. 4B, a circuit 500 for sensing a magnetic field includes aspects of the circuit 70 of FIG. 2 in combination with aspects of the circuit 150 of FIG. 3. Namely, the circuit 500 includes two piezoresistors as in FIG. 2 for sensing strain of a substrate, which is indirectly related to a sensitivity of a Hall effect element, and also includes a conductor as in FIG. 3, which is proximate to the Hall effect element to directly sense the changes in sensitivity of the Hall effect element.

The circuit 500 can be the same as or similar to the circuit 10 of FIG. 1 and can include a feedback circuit 502, which can be the same as or similar to the feedback circuit 12 of FIG. 1. The feedback circuit 502 is described more fully below.

The circuit 500 includes a magnetic field sensing element 524, here a Hall effect element. The Hall effect element 524 is coupled to receive a drive current signal 566 from a current source 564 and configured to generate a differential Hall voltage signal 568, 570, which is coupled to a preamplifier 572. The preamplifier 572 is configured to amplify the differential input signal 568, 570 and to generate an amplified signal 564. The circuit 500 can also include a low pass filter 574 coupled to receive the amplified signal 564 and configured to generate a filtered signal 576. The circuit 500 can also include another circuit element 578 coupled to receive the filtered signal 576 and configured to generate an output signal 580. In some arrangements, the circuit element 578 is a (linear) amplifier, and, in other arrangements, the circuit element 578 is a comparator.

The feedback circuit 502 can include first and second piezoresistors 512, 520, respectively. As described more fully below, the feedback circuit 502, and the piezoresistors 512, 520 in particular, can measure a strain of the Hall effect element 524, and the feedback circuit 502 can generate the feedback signal 554 related to the strain.

The first piezoresistor 512 can be coupled to receive a first current signal 510 from a first current source 508, which results in a first voltage signal 510a. The feedback circuit 502 can also include a first amplifier 514 coupled to receive the first voltage signal 510a and configured to generate a first amplified signal 526.

Similarly, the second piezoresistor 520 can be coupled to receive a second current signal 518 from a second current source 516, which results in a second voltage signal 518a. The feedback circuit 502 can also include a second amplifier 528 coupled to receive the second voltage signal 518a and configured to generate a second amplified signal 530.

The feedback circuit 502 can also include a conductor 522, here shown to form a loop around the Hall effect element 524. The conductor 522 can be coupled to receive a current signal 562 from a current source 560. The current source 560 can be coupled to receive a pulse signal 556 generated by a pulse generator 558. The pulse signal 556 can result in a pulse current signal 556. In some arrangements, the pulse current signal 556 has two states, a first state during which essentially zero current flows into the conductor 522, and a second state during which a predetermined current flows into the conductor 522. In some arrangements, a duty cycle of the second state can be small, for example, in the range of about one percent to about five percent. In some arrangements, a frequency of the pulse current signal 556 is in the range of about 25 kHz to 500 kHz.

The feedback circuit 502 can also include first and second sample-and-hold circuits 548, 540, respectively, each coupled to receive the amplified signal 564, and which generate first and second samples signals 534, 536, respectively.

The first sample-and-hold circuit 548 receives the pulse signal 556 and samples during a particular state of the pulse signal 556, for example, at times when the current signal 562 has a current pulse. The second sample-and-hold circuit 540 receives an inverted pulse signal 544 generated by an inverter 546 and samples during a particular state of the inverted pulse signal 544, for example, at times when the current signal 562 has no current pulse. It should be appreciated that the second sampled signal 536 is representative of the magnetic field that the circuit 500 is intended to measure, while the first sampled signal 534 is representative of the magnetic field that the circuit 500 is intended to measure in combination with the magnetic field resulting from current signal 562 having the above-described current pulses.

The feedback circuit 502 can further include a combining circuit 532 coupled to receive the first and second amplified signals 526, 530, respectively, and also coupled to receive the first and second sampled signals 534, 536, respectively. The combining circuit is configured to generate an output signal 552. In some arrangements, the feedback circuit 502 further includes a sample-and-hold circuit 550 coupled to receive the output signal 552. The sample-and-hold circuit 550 can be coupled to receive the pulse signal, a state or transition of which results in the sample-and-hold circuit 550 sampling the output signal 552 and generating the gain-control signal 554 accordingly.

The pulse generator 558 can be responsive to an enable signal 506, which can be a temperature enable signal, a power-on enable signal, or a combination of both. To this end, the circuit 500 can include one or both of a temperature threshold circuit and/or a power-on circuit, which are described above in conjunction with FIGS. 1-1B. However, the temperature threshold circuit and/or a power-on circuit are not shown for clarity; instead, only the enable signal 506 is shown.

It should be apparent from the above discussion that the sample-and-hold circuit 550 can sample the output signal 552 to generate the gain-adjustment signal 554 during times when the temperature enable signal or the power-on enable signal are active, e.g., when the temperature of the circuit has increased above a temperature threshold or when power has recently been applied to the circuit 500. Conversely, the sample-and-hold circuit 550 can hold the gain-adjustment signal 554 during times when the temperature enable signal or the power-on enable signal are inactive, e.g., when the temperature decreases from being above the temperature threshold to being below the temperature threshold or at a time after power has been applied to the circuit 500.

The enable signal 506 can also be received by the first and second current sources 508, 516, respectively, causing the first and second current sources 508, 516 to generate the first and second current signals 510, 518 only when the enable signal 506 is active. With this arrangement, the circuit 500 can conserve power at times when gain adjustment is not required, for example, when the temperature of the circuit 500 has not exceeded the temperature threshold.

In some arrangements, the first and second piezoresistors 512, 520 are arranged orthogonally over the substrate on which they are disposed. With this arrangement, a value of the first voltage signal 510*a* is related to a strain in a first direction parallel to a major surface of the substrate and a value of the second voltage signal 518*a* is related to a strain in a second direction parallel to a major surface of the substrate and orthogonal to the first direction. With this arrangement, a strain of the substrate in any direction parallel to a major surface of the substrate can be sensed by the piezoresistors 512, 520.

In some arrangements, the combining circuit 532 provides the output signal 552 and resulting gain-adjustment signal 554 as a sum of the amplified signals 526, 530 plus a difference of the first sampled signal 534 and the second sampled signal 536. In other arrangements, the combining circuit 532 provides the output signal 552 and resulting gain-adjustment signal 554 as a root-mean-square (RMS) sum of the amplified signals 526, 530 plus an RMS difference of the first sampled signal 534 and the second sampled signal 536. In still other arrangements, particularly arrangements for which the sensitivity of the magnetic field sensing element 524 is a non-linear function of the strain of the substrate over which it is disposed, the combining circuit 532 can combine the amplified signals 526, 530 and the sampled signals 534, 536 in other ways.

The low pass filter 574 essentially removes the pulses in the amplified signal 564 resulting from the above-described current pulses 562, leaving the filtered signal 576 representative of only the magnetic field that the circuit 500 is intended to measure. It will be understood that the filtered signal 576 is similar to the second sampled signal 564 and, in other embodiments, either signal can be used interchangeably. Thus, the filtered signal 576 is shown to be coupled with a dashed line to the combining circuit 532.

In operation, the gain-adjustment signal 554 adjusts the current signal 566, and therefore, the sensitivity of the Hall effect element 524 in relation to the strains sensed by the first and second piezoresistors 512, 512, and also in relation to magnetic field sensitivity of the Hall effect element 524, tending to keep the sensitivity of the circuit 500 more constant in the presence of strains and the temperature excursions than if the gain-adjustment signal 554 were not provided.

While the feedback circuit 502 is shown to control the gain associated with the Hall effect element 524 by way of the current source 564, in other embodiments, the gain-adjustment signal 554 can be applied to a gain-adjustable preamplifier in place of the preamplifier 572.

In some alternate arrangements, the circuit 500 has only one of the piezoresistors 512, 520.

Figure 5:
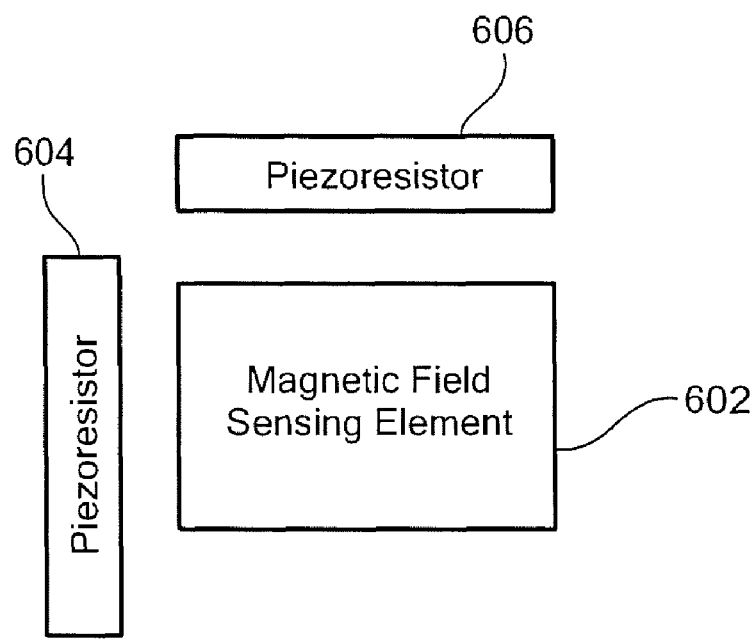
FIG. 5 is a block diagram showing a magnetic field sensing element in relation to two piezoresistors.

Referring now to FIG. 5, a variety of physical configurations are shown that depict more detail of arrangements of piezoresistors and current conductors shown above in FIGS. 2-4B.

Referring now to FIG. 5, first and second piezoresistors 504, 506 are proximate to a magnetic field sensing element 502. This arrangement is shown and described at least in conjunction with FIGS. 2 and 2A. As described above, in some arrangements, the first and second piezoresistors 604, 606 are arranged orthogonally over the substrate (not shown) on which they are disposed.

Figure 6:
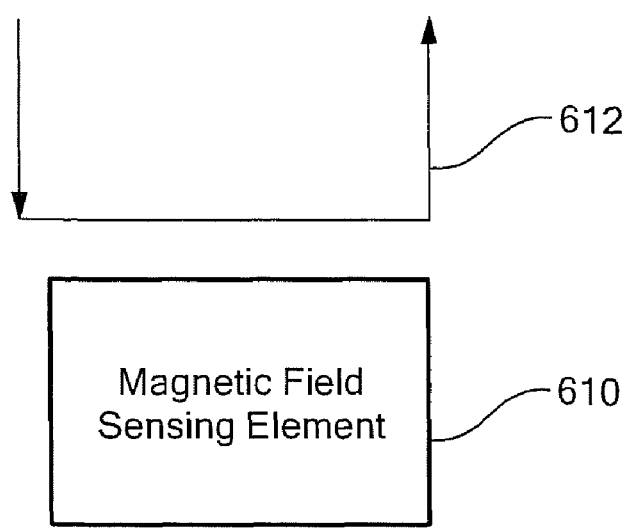
FIG. 6 is a block diagram showing a magnetic field sensing element and a current conductor proximate to the magnetic field sensing element.

Referring now to FIG. 6, a current conductor 612 is proximate to a magnetic field sensing element 610. This arrangement is shown and described at least in conjunction with FIGS. 3-3B. While the current conductors 164 and 252 of FIGS. 3-3B are shown to be coils surrounding respective magnetic field sensing elements, it should be recognized that the conductors can either be coils as shown in FIGS. 3-3B, or non-coils proximate to the magnetic field sensing element as shown in FIG. 6.

Figure 7:
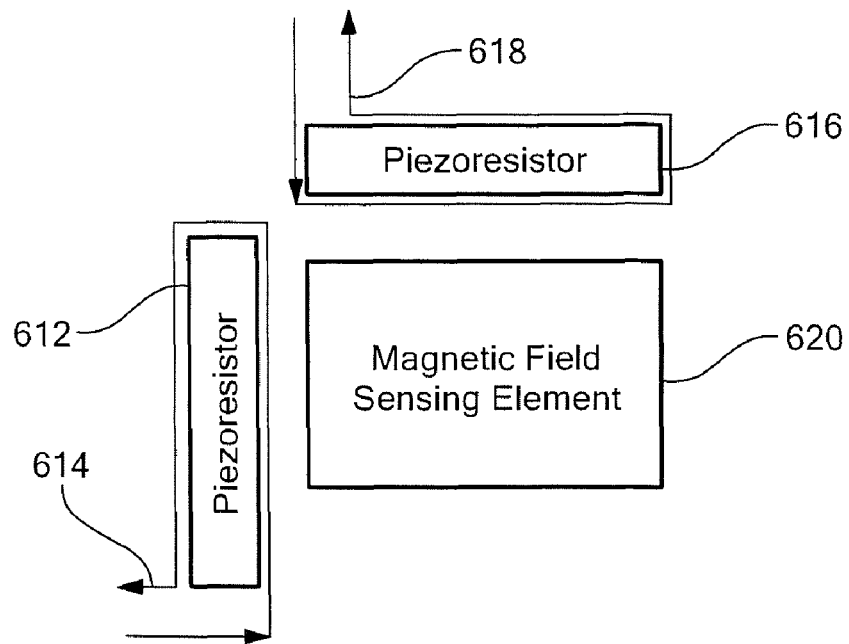
FIG. 7 is a block diagram showing a magnetic field sensing element, two piezoresistors, and a respective conductor proximate to each piezoresistor.

Referring now to FIG. 7, first and second piezoresistors 612, 616 are proximate to a magnetic field sensing element 620. A first conductor 614 partially surrounds the first piezoresistor 612 and a second conductor 618 partially surrounds the second piezoresistor 616. This arrangement is shown and described at least in conjunction with FIGS. 4 and 4A. While the current conductors 314, 322, 414, 422 of FIGS. 4 and 4A are shown to be coils entirely surrounding respective piezoresistors, it should be recognized that the conductors can either be coils as shown in FIGS. 4 and 4A, or open coils as shown in FIG. 7, or non-coils as shown in FIG. 6.

Figure 8:
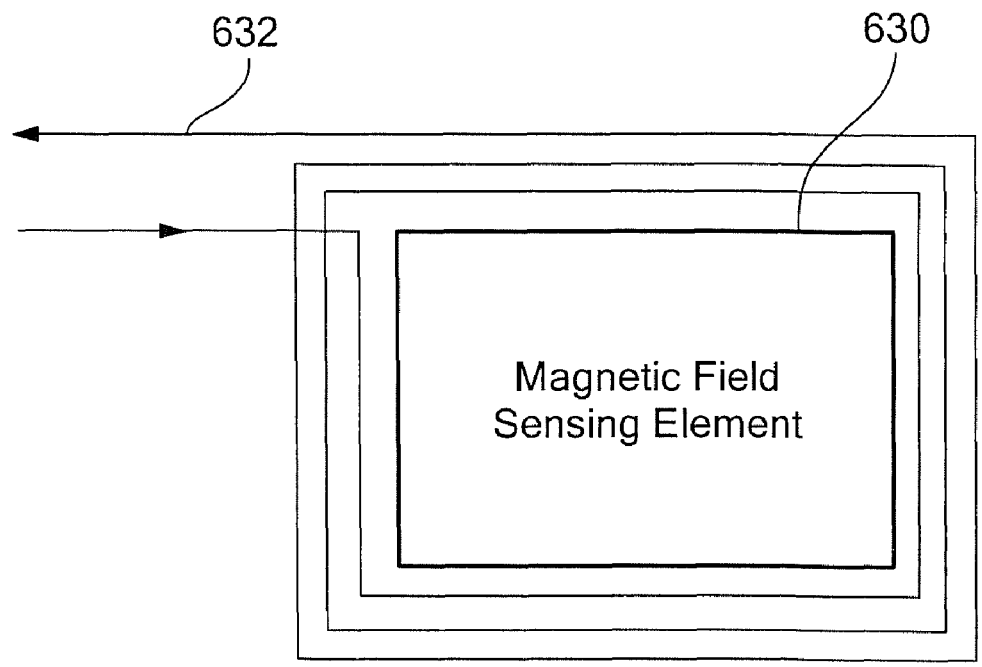
FIG. 8 is a block diagram showing a magnetic field sensing element and a current conductor formed in multiple loops around the magnetic field sensing element.

Referring now to FIG. 8, a current conductor 632 is proximate to a magnetic field sensing element 630. This arrangement is shown and described at least in conjunction with FIGS. 3-3B. While the current conductors 164 and 252 of FIGS. 3-3B are shown to be single loop coils surrounding respective magnetic field sensing elements, it should be recognized that the conductors can either be single loop coils as shown in FIGS. 3-3B, multi-loop coils as shown in FIG. 8, or non-coils proximate to the magnetic field sensing element 630 as shown in FIG. 6.

While Hall effect elements driven by current sources (e.g., 108, 136, FIG. 2A) are described above, in other embodiments, the current sources can be replaced by voltage sources (e.g., controllable voltage sources), or by voltage sources in series with resistors.

All references cited herein are hereby incorporated herein by reference in their entirety.

Having described preferred embodiments of the invention, it will now become apparent to one of ordinary skill in the art that other embodiments incorporating their concepts may be used. It is felt therefore that these embodiments should not be limited to disclosed embodiments, but rather should be limited only by the spirit and scope of the appended claims.

What is claimed is:

1. A magnetic field sensor, comprising:
a magnetic field sensing element supported by a substrate, the magnetic field sensing element for generating an output signal comprising a magnetic-field-responsive signal portion, wherein the magnetic-field-responsive signal portion has a sensitivity to a first magnetic field;
a feedback circuit, comprising:
 a current conductor supported by the substrate and proximate to the magnetic field sensing element, the current conductor for generating a second magnetic field; and
 a gain-calculation circuit configured to generate a gain-calculated signal and a gain-adjustment signal both responsive to the second magnetic field, wherein the gain-calculation circuit comprises a sample-and-hold circuit configured to sample and hold the gain-calculated signal in response to an enable signal to generate the gain-adjustment signal; and
a gain-adjustment circuit supported by the substrate and having a gain-adjustment node coupled to receive the gain-adjustment signal, wherein the gain-adjustment circuit is configured to adjust the sensitivity of the magnetic-field-responsive signal portion in response to the gain-adjustment signal.

2. The magnetic field sensor of claim 1, wherein the output signal generated by the magnetic field sensing element comprises both the magnetic-field-responsive signal portion and also a gain-adjustment-signal-related portion responsive to the second magnetic field and related to the gain-adjustment signal, wherein the gain-adjustment-signal-related portion comprises an AC signal component, wherein the magnetic field sensor further comprises a filter circuit coupled to the magnetic field sensing element and configured to separate the gain-adjustment-signal-related portion from the magnetic-field-responsive signal portion.

3. The magnetic field sensor of claim 2, wherein the feedback circuit further comprises:
a current generator circuit having an output node at which current pulses are generated, wherein the current conductor is coupled to receive the current pulses resulting in the second magnetic field, wherein the AC signal component of the gain-adjustment-signal-related portion is related to an AC signal component of the current pulses.

4. The magnetic field sensor of claim 1, wherein the magnetic field sensing element is a Hall effect element, wherein the gain-adjustment circuit comprises a current generator coupled to the Hall element, the current generator having a control node coupled to receive the gain-adjustment signal.

5. The magnetic field sensor of claim 1, wherein the gain-adjustment circuit comprises an amplifier coupled to receive the output signal from to the magnetic field sensing element, the amplifier having a control node coupled to receive the gain-adjustment signal.

6. The magnetic field sensor of claim 1, wherein the feedback circuit further comprises:
a second magnetic field sensing element supported by the substrate, wherein the second magnetic field sensing element is responsive to the second magnetic field, and wherein the second magnetic field sensing element generates an output signal related to the gain-adjustment signal.

7. The magnetic field sensor of claim 1, wherein the feedback circuit further comprises:
a first piezoresistor supported by the substrate, the first piezoresistor having a node at which a first piezoelectric output signal is generated, wherein the first piezoelectric output signal is responsive to a strain of the substrate in a first direction and also responsive to the second magnetic field, wherein the first piezoelectric output signal is related to the gain-adjustment signal.

8. The magnetic field sensor of claim 7, wherein the feedback circuit further comprises:
a second piezoresistor supported by the substrate, each one of the first and second piezoresistors having a respective primary response axis, wherein the first and second piezoresistors are disposed in a relative orientation so that their respective primary response axes are generally perpendicular, the second piezoresistor having a node at which a second piezoelectric output signal is generated, wherein the second piezoelectric output signal is responsive to a strain of the substrate in a second direction generally perpendicular to the first direction and also responsive to the second magnetic field, wherein the second piezoelectric output signal is also related to the gain-adjustment signal, wherein the gain-calculation circuit comprises a combining circuit having first and second input nodes coupled to receive signals related to the first and second piezoelectric output signals and having an output node at which the gain-adjustment signal is generated.

9. The magnetic field sensor of claim 8, wherein the current conductor comprises first and second current conductors, and wherein the second magnetic field comprises first and second magnetic field portions, wherein the first piezoresistor is responsive to the first magnetic field portion and the second piezoresistor is responsive to the second magnetic field portion.

10. The magnetic field sensor of claim 8, wherein the output signal generated by the magnetic field sensing element comprises both the magnetic-field-responsive signal portion and also a gain-adjustment-signal-related portion responsive to the second magnetic field and related to the gain-adjustment signal, wherein the gain-adjustment-signal-related portion comprises an AC signal component, wherein the magnetic field sensor further comprises a filter circuit coupled to the magnetic field sensing element and configured to separate the gain-adjustment-signal-related portion from the magnetic-field-responsive signal portion.

11. The magnetic field sensor of claim 10, wherein the feedback circuit further comprises:
a current generator circuit having an output node at which current pulses are generated, wherein the current conductor is coupled to receive the current pulses resulting in the second magnetic field, wherein the AC signal component of the gain-adjustment-signal-related portion is related to an AC signal component of the current pulses.

12. The magnetic field sensor of claim 8, wherein the magnetic field sensing element is a Hall effect element, wherein the gain-adjustment circuit comprises a current generator coupled to the Hall element, the current generator having a control node coupled to receive the gain-adjustment signal.

13. The magnetic field sensor of claim 8, wherein the gain-adjustment circuit comprises an amplifier coupled to receive the output signal from to the magnetic field sensing element, the amplifier having a control node coupled to receive the gain-adjustment signal.

14. The magnetic field sensor of claim 1, further comprising a temperature threshold circuit configured to generate a temperature enable signal in response to a temperature being above a temperature threshold, wherein selected portions of the feedback circuit turn on or off depending upon a state of the temperature enable signal.

15. The magnetic field sensor of claim 1, further comprising a power-on circuit configured to generate a power-on enable signal in response to the magnetic field sensor being powered on, wherein selected portions of the feedback circuit turn on or off depending upon a state of the power-on enable signal.

16. A magnetic field sensor, comprising:
a magnetic field sensing element supported by a substrate, the magnetic field sensing element for generating an output signal comprising a magnetic-field-responsive signal portion, wherein the magnetic-field-responsive signal portion has a sensitivity to a first magnetic field;
a feedback circuit, comprising:
a current conductor supported by the substrate and proximate to the magnetic field sensing element, the current conductor for generating a second magnetic field;
a second magnetic field sensing element supported by the substrate, wherein the second magnetic field sensing element is responsive to the second magnetic field; and
a gain-calculation circuit configured to generate a gain-adjustment signal responsive to the second magnetic field, wherein the second magnetic field sensing element generates an output signal related to the gain-adjustment signal; and
a gain-adjustment circuit supported by the substrate and having a gain-adjustment node coupled to receive the gain-adjustment signal, wherein the gain-adjustment circuit is configured to adjust the sensitivity of the magnetic-field-responsive signal portion in response to the gain-adjustment signal.

17. A magnetic field sensor, comprising:
a magnetic field sensing element supported by a substrate, the magnetic field sensing element for generating an output signal comprising a magnetic-field-responsive signal portion, wherein the magnetic-field-responsive signal portion has a sensitivity to a first magnetic field;
a feedback circuit, comprising:
a current conductor supported by the substrate and proximate to the magnetic field sensing element, the current conductor for generating a second magnetic field;
a first piezoresistor supported by the substrate, the first piezoresistor having a node at which a first piezoelectric output signal is generated, wherein the first piezoelectric output signal is responsive to a strain of the substrate in a first direction and also responsive to the second magnetic field; and
a gain-calculation circuit configured to generate a gain-adjustment signal responsive to the second magnetic field, wherein the first piezoelectric output signal is related to the gain-adjustment signal; and
a gain-adjustment circuit supported by the substrate and having a gain-adjustment node coupled to receive the gain-adjustment signal, wherein the gain-adjustment circuit is configured to adjust the sensitivity of the magnetic-field-responsive signal portion in response to the gain-adjustment signal.

18. The magnetic field sensor of claim 17, wherein the feedback circuit further comprises:
a second piezoresistor supported by the substrate, each one of the first and second piezoresistors having a respective primary response axis, wherein the first and second piezoresistors are disposed in a relative orientation so that their respective primary response axes are generally perpendicular, the second piezoresistor having a node at which a second piezoelectric output signal is generated, wherein the second piezoelectric output signal is responsive to a strain of the substrate in a second direction generally perpendicular to the first direction and also responsive to the second magnetic field, wherein the second piezoelectric output signal is also related to the gain-adjustment signal, wherein the gain-calculation circuit comprises a combining circuit having first and second input nodes coupled to receive signals related to the first and second piezoelectric output signals and having an output node at which the gain-adjustment signal is generated.

19. The magnetic field sensor of claim 18, wherein the current conductor comprises first and second current conductors, and wherein the second magnetic field comprises first and second magnetic field portions, wherein the first piezoresistor is responsive to the first magnetic field portion and the second piezoresistor is responsive to the second magnetic field portion.

20. The magnetic field sensor of claim 18, wherein the output signal generated by the magnetic field sensing element comprises both the magnetic-field-responsive signal portion and also a gain-adjustment-signal-related portion responsive to the second magnetic field and related to the gain-adjustment signal, wherein the gain-adjustment-signal-related portion comprises an AC signal component, wherein the magnetic field sensor further comprises a filter circuit coupled to the magnetic field sensing element and configured to separate the gain-adjustment-signal-related portion from the magnetic-field-responsive signal portion.

21. The magnetic field sensor of claim 20, wherein the feedback circuit further comprises:
a current generator circuit having an output node at which current pulses are generated, wherein the current conductor is coupled to receive the current pulses resulting in the second magnetic field, wherein the AC signal component of the gain-adjustment-signal-related portion is related to an AC signal component of the current pulses.

22. The magnetic field sensor of claim 18, wherein the magnetic field sensing element is a Hall effect element, wherein the gain-adjustment circuit comprises a current generator coupled to the Hall element, the current generator having a control node coupled to receive the gain-adjustment signal.

23. The magnetic field sensor of claim 18, wherein the gain-adjustment circuit comprises an amplifier coupled to receive the output signal from to the magnetic field sensing element, the amplifier having a control node coupled to receive the gain-adjustment signal.

* * * * *

UNITED STATES PATENT AND TRADEMARK OFFICE
CERTIFICATE OF CORRECTION

| | | |
|---|---|---|
| PATENT NO. | : 7,923,996 B2 | Page 1 of 1 |
| APPLICATION NO. | : 12/037393 | |
| DATED | : April 12, 2011 | |
| INVENTOR(S) | : Doogue et al. | |

It is certified that error appears in the above-identified patent and that said Letters Patent is hereby corrected as shown below:

Column 2, line 63 delete "and or" and replace with --and/or--.

Column 4, line 54 delete "elements" and replace with --element--.

Column 5, line 49 delete "as pulse" and replace with --as a pulse--.

Column 6, line 27 delete "signal 72726" and replace with --signal 726--.

Column 6, line 42 delete "experiences" and replace with --experienced--.

Column 7, line 19 delete "one" and replace with --on--.

Column 8, line 60, delete "In arrangements," and replace with --In some arrangements,--.

Column 15, line 7 delete "and the temperature" and replace with --and temperature--.

Column 16, line 41 delete "signal" and replace with --signals--.

Column 17, line 32 delete "signal" and replace with --signals--.

Column 17, line 38 delete "signal" and replace with --signals--.

Column 18, line 48 delete "556" and replace with --562--.

Column 18, line 49 delete "556" and replace with --562--.

Column 18, line 55 delete "556" and replace with --562--.

Column 18, line 60 delete "samples" and replace with --sampled--.

Column 22, line 3 delete "from to the" and replace with --from the--.

Column 23, line 9 delete "from to the" and replace with --from the--.

Column 24, line 61 delete "from to the" and replace with --from the--.

Signed and Sealed this
Twenty-third Day of August, 2011

David J. Kappos
*Director of the United States Patent and Trademark Office*